(12) United States Patent
Ariyoshi et al.

(10) Patent No.: US 8,741,727 B2
(45) Date of Patent: Jun. 3, 2014

(54) METHOD OF MANUFACTURING SEMICONDUCTOR DEVICE CAPABLE OF REDUCING A SIZE OF THE SEMICONDUCTOR DEVICE

(75) Inventors: Junichi Ariyoshi, Yokohama (JP); Taiji Ema, Yokohama (JP); Toru Anezaki, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 67 days.

(21) Appl. No.: 13/106,129

(22) Filed: May 12, 2011

(65) Prior Publication Data
US 2012/0034751 A1  Feb. 9, 2012

(30) Foreign Application Priority Data
Aug. 6, 2010  (JP) .................... 2010-177463

(51) Int. Cl.
*H01L 21/02* (2006.01)
(52) U.S. Cl.
USPC ............. 438/381; 257/316; 257/E21.008; 257/E47.001; 438/257
(58) Field of Classification Search
USPC ........... 257/316, E21.008, E47.001; 438/381, 438/257
See application file for complete search history.

(56) References Cited

U.S. PATENT DOCUMENTS

| 6,417,073 | B2 * | 7/2002 | Watanabe ............... 438/424 |
| 6,627,943 | B2 * | 9/2003 | Shin et al. ............... 257/315 |
| 6,798,015 | B2 * | 9/2004 | Kasuya ................. 257/316 |
| 2006/0094229 | A1 | 5/2006 | Ema et al. |
| 2007/0293029 | A1 | 12/2007 | Ogawa et al. |
| 2009/0039411 | A1 | 2/2009 | Anezaki |
| 2009/0045451 | A1 * | 2/2009 | Ema et al. ............... 257/316 |

FOREIGN PATENT DOCUMENTS

| JP | 2006-128508 A | 5/2006 |
| JP | 2007-335559 A | 12/2007 |
| JP | 2009-044053 A | 2/2009 |

* cited by examiner

*Primary Examiner* — Lex Malsawma
*Assistant Examiner* — Sheng Zhu
(74) *Attorney, Agent, or Firm* — Westerman, Hattori, Daniels & Adrian, LLP

(57) ABSTRACT

A method of manufacturing a semiconductor device includes forming a flash memory cell in a first region, forming a first electrode of a capacitor in a second region, forming a first silicon oxide film, a silicon nitride film, and a second silicon oxide film in this order as a second insulating film, removing the silicon nitride film and the second silicon oxide film in a partial region of the first electrode, wet-etching a first insulating film and the second insulating film in the third region, forming a second electrode of the capacitor, and etching and removing the first silicon oxide film in the partial region.

20 Claims, 34 Drawing Sheets

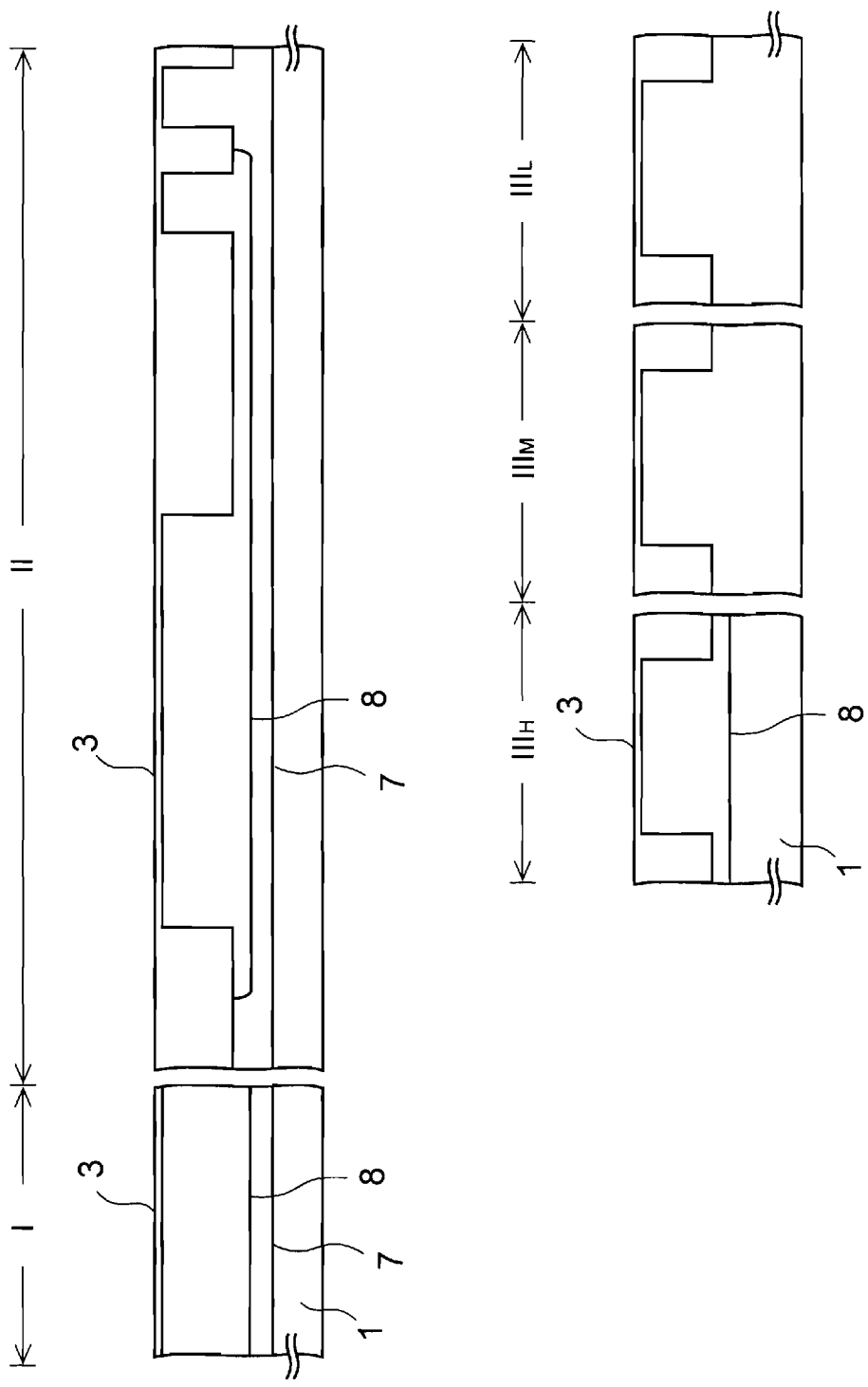

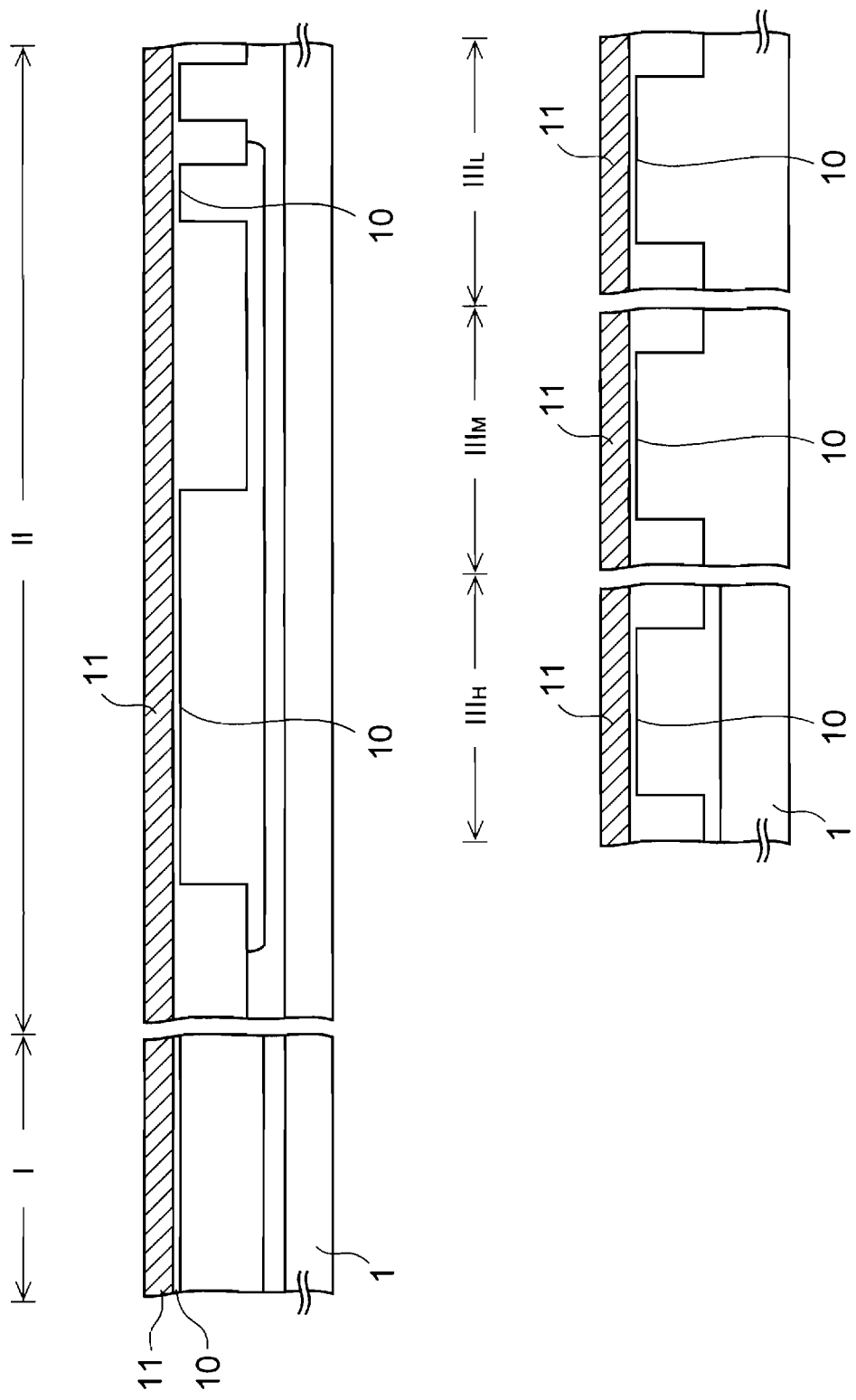

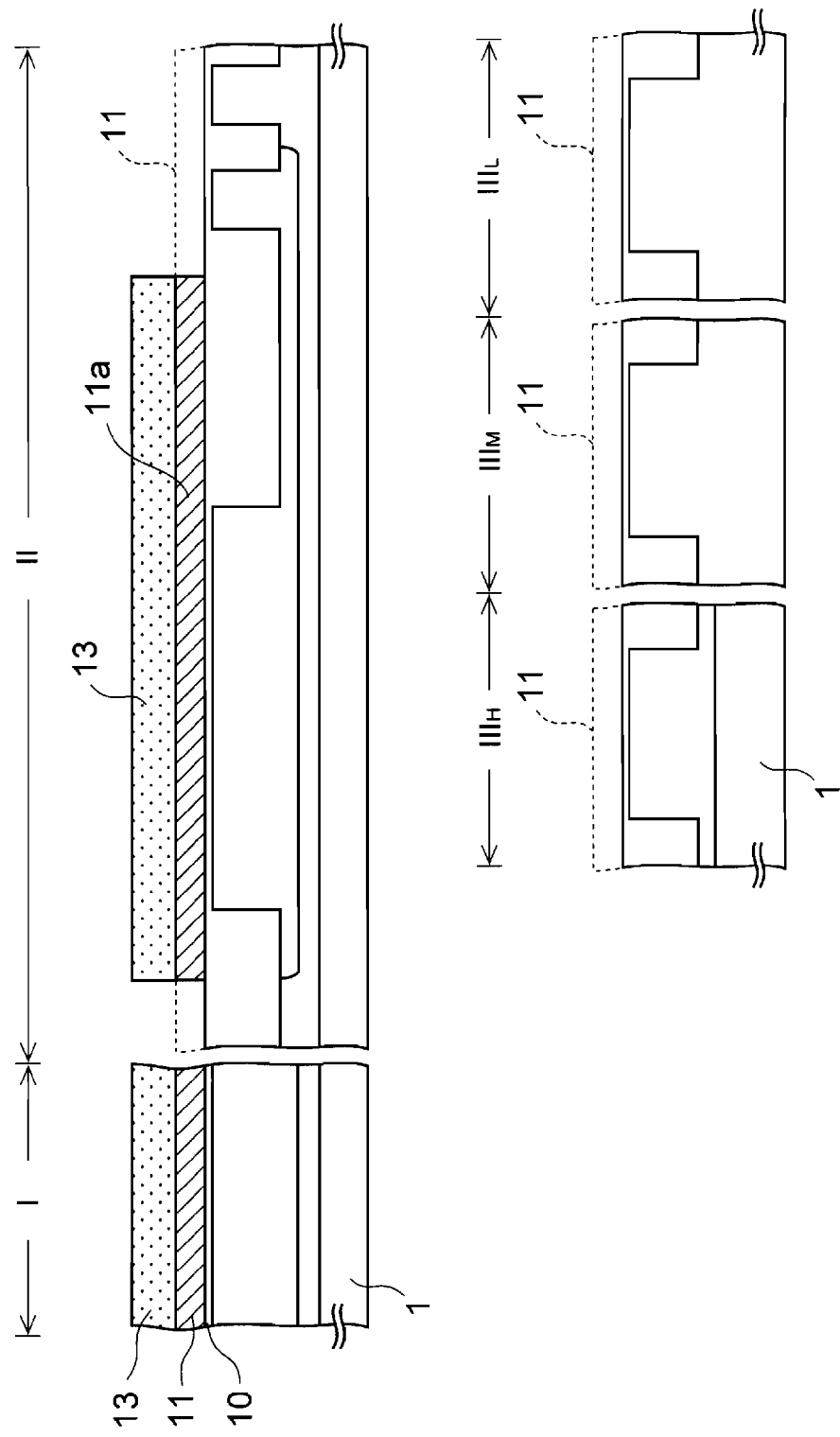

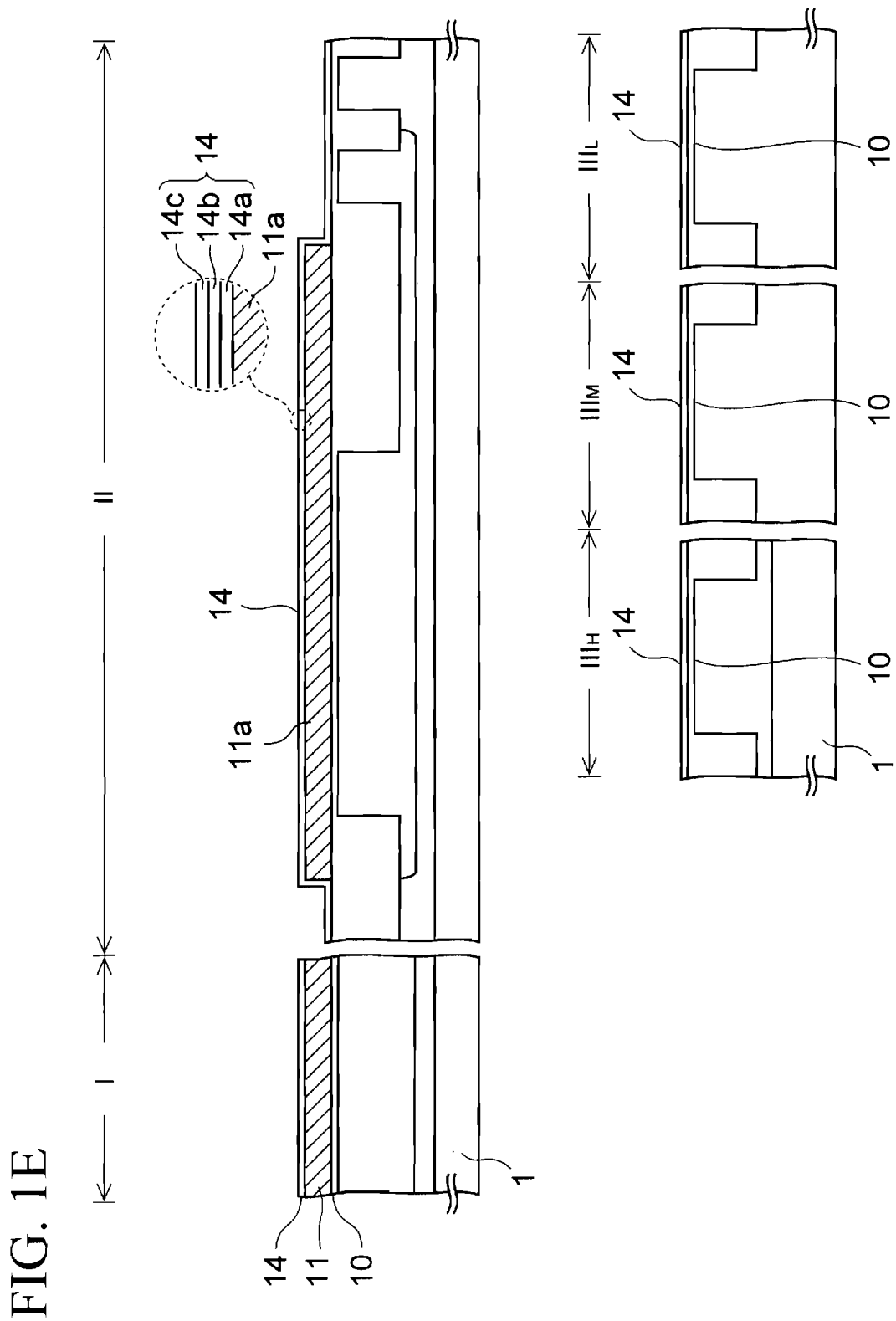

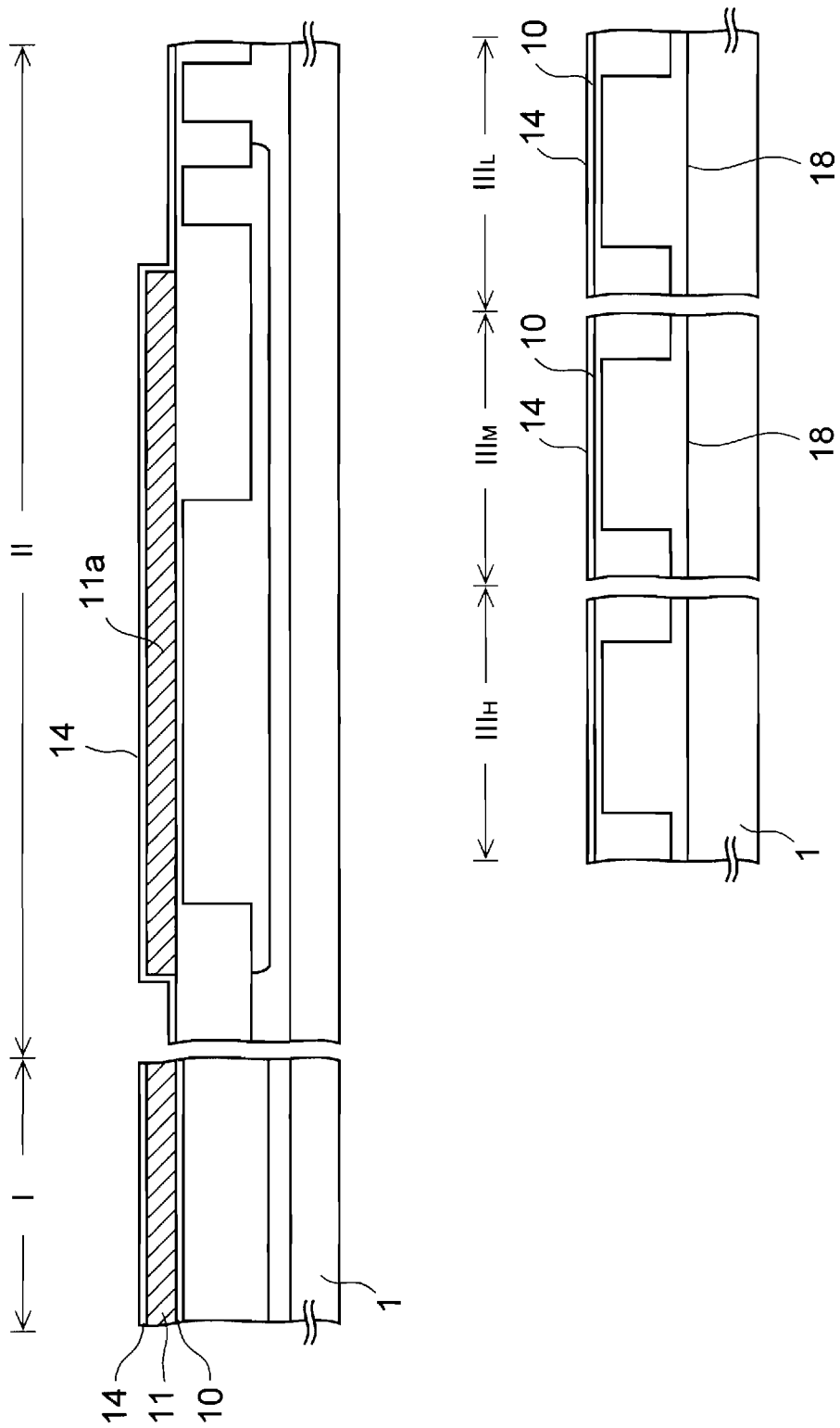

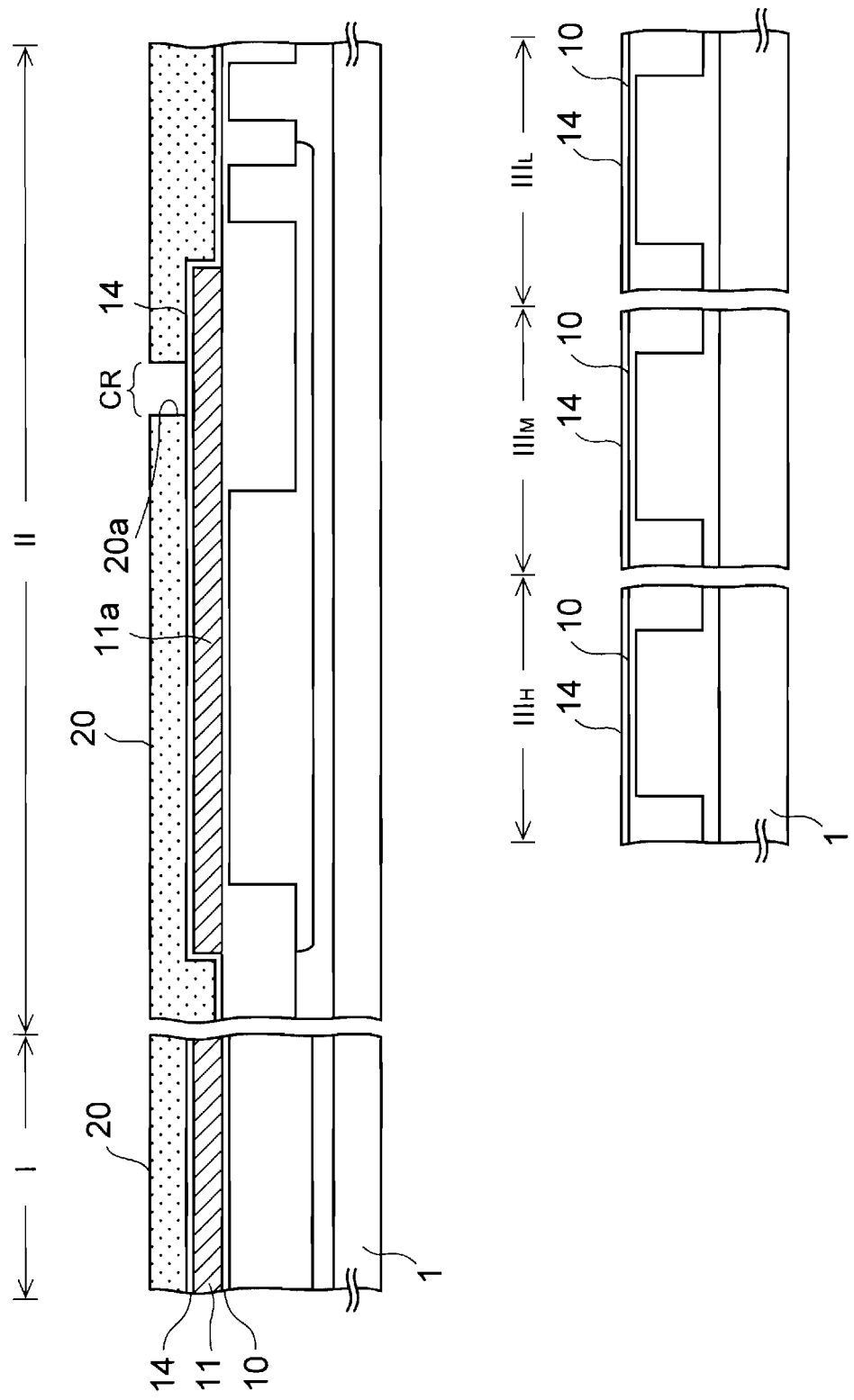

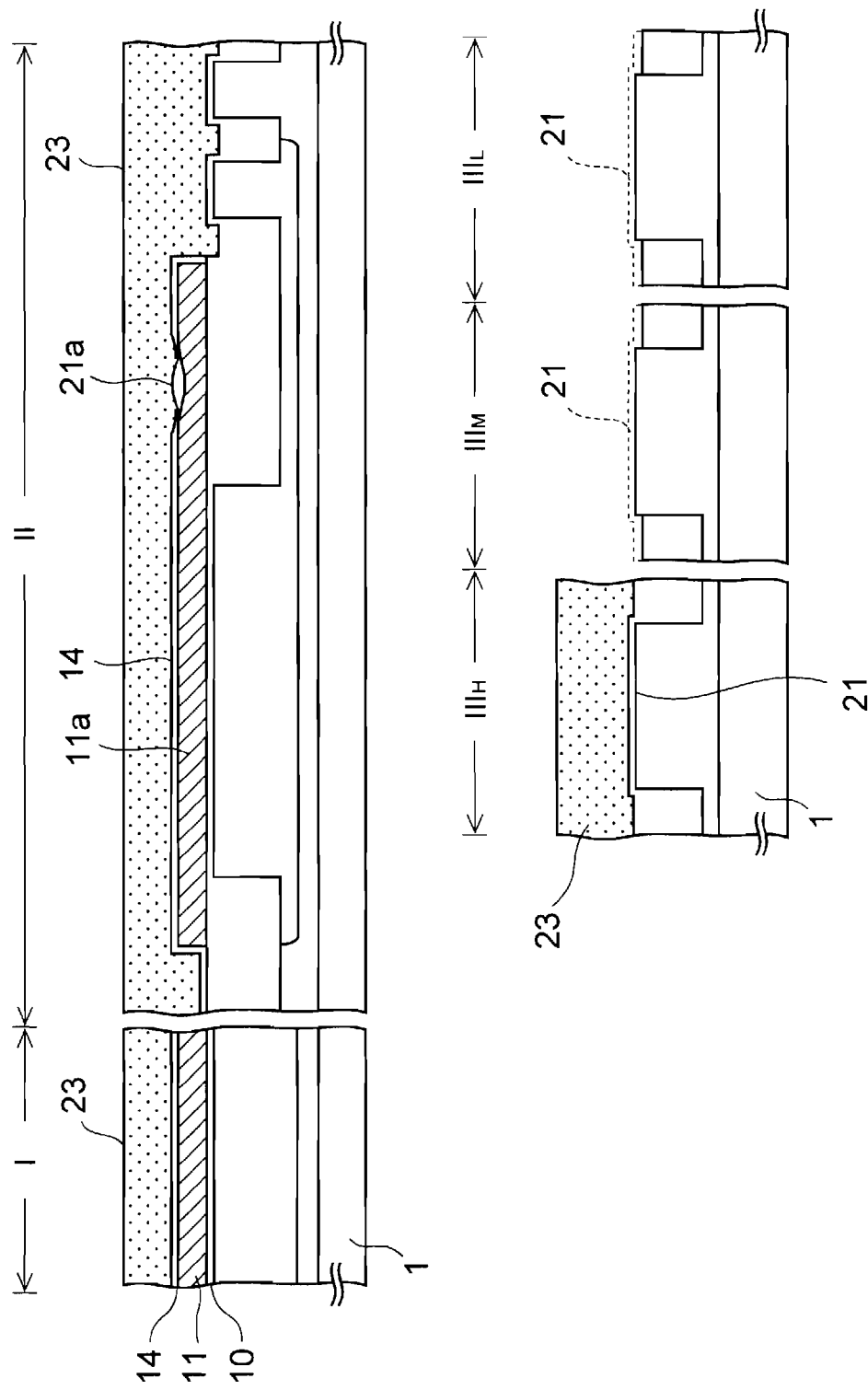

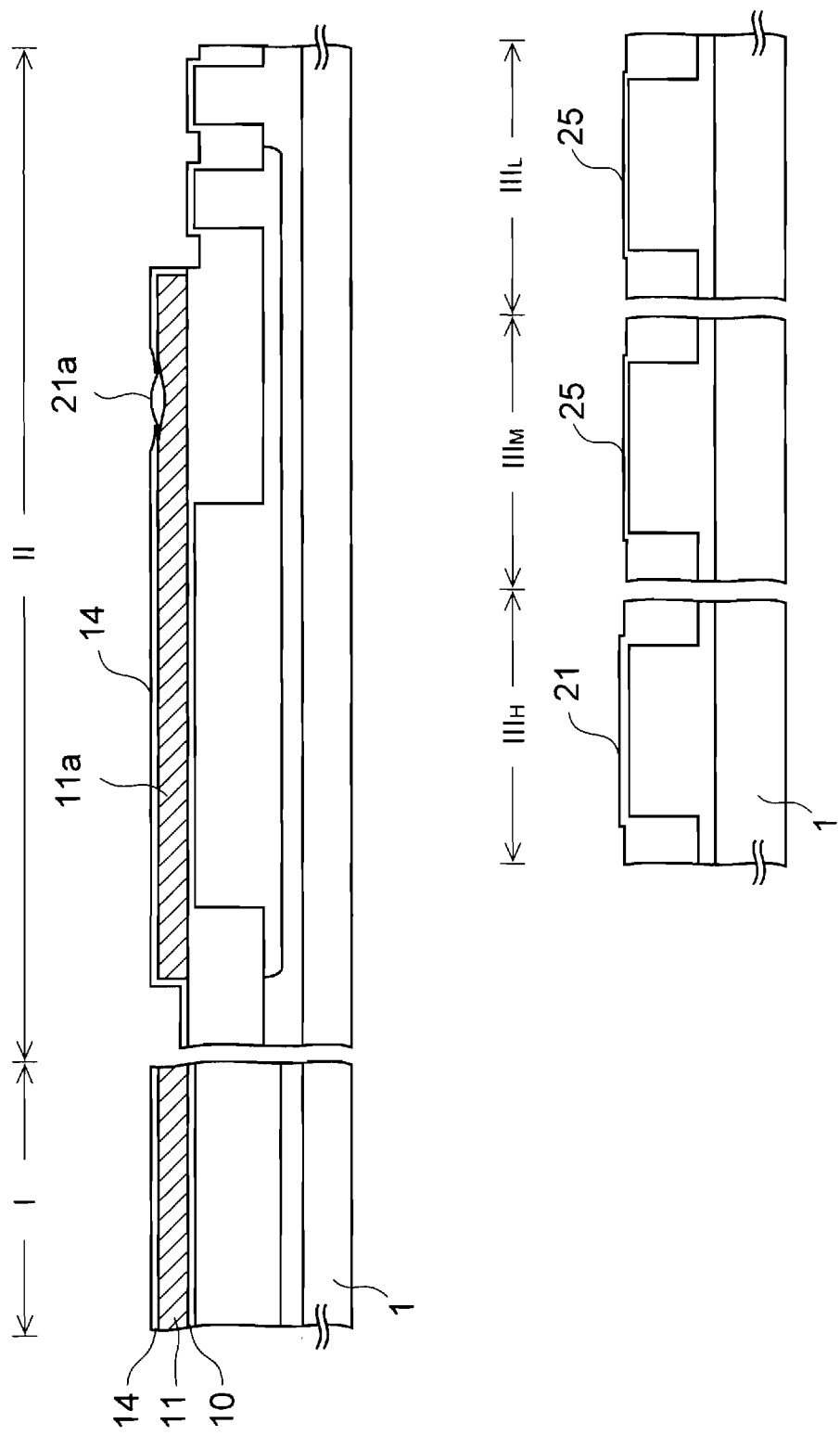

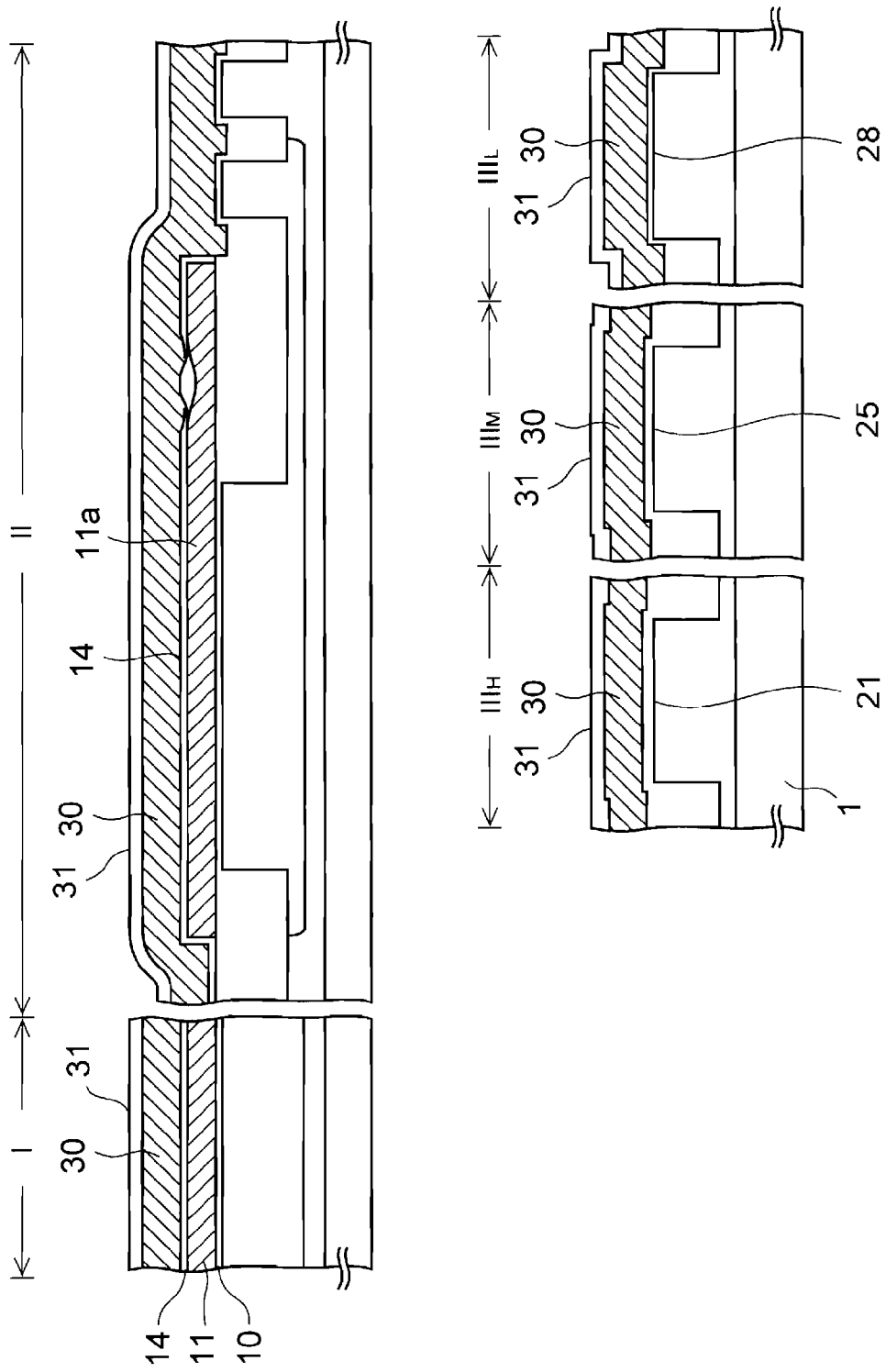

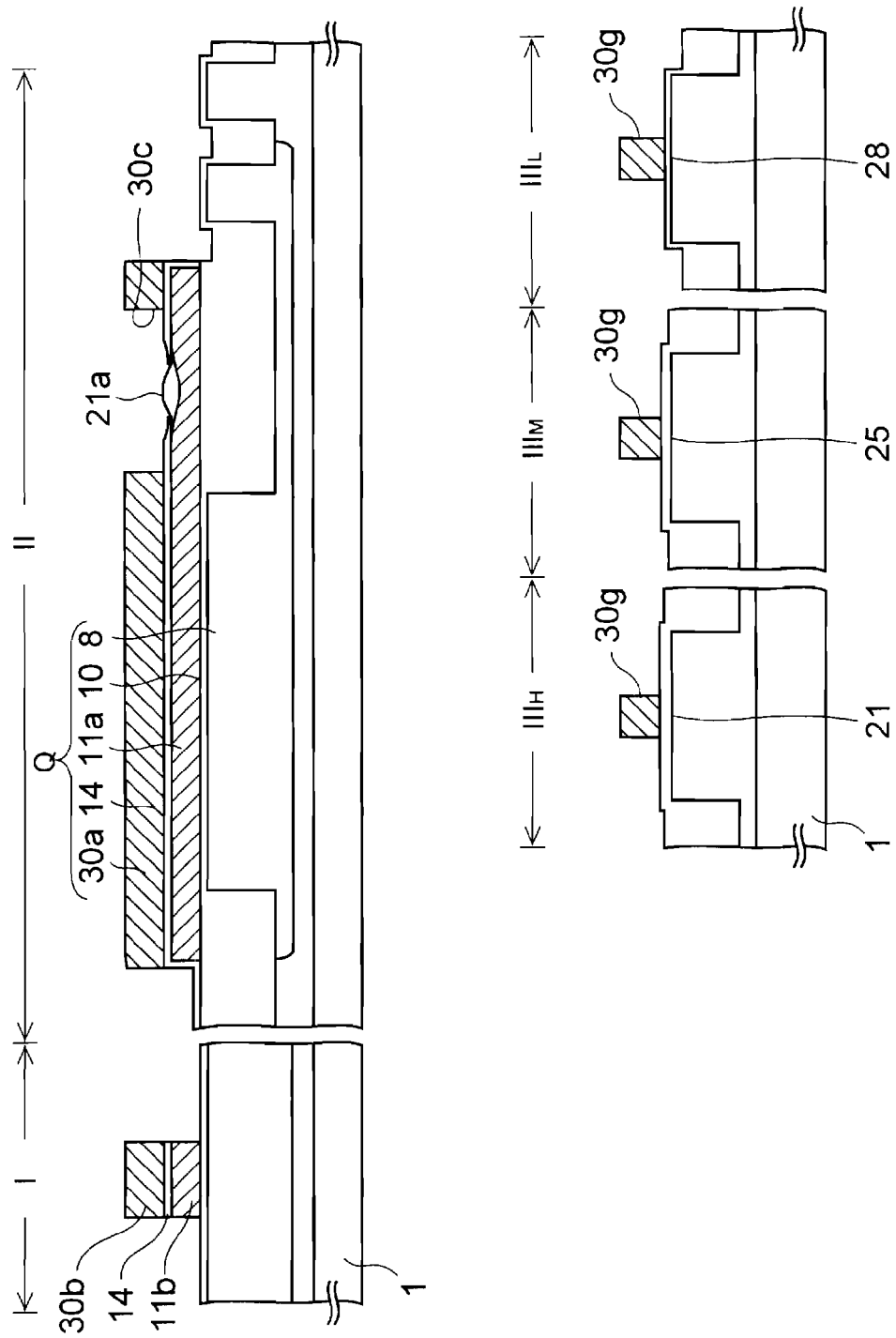

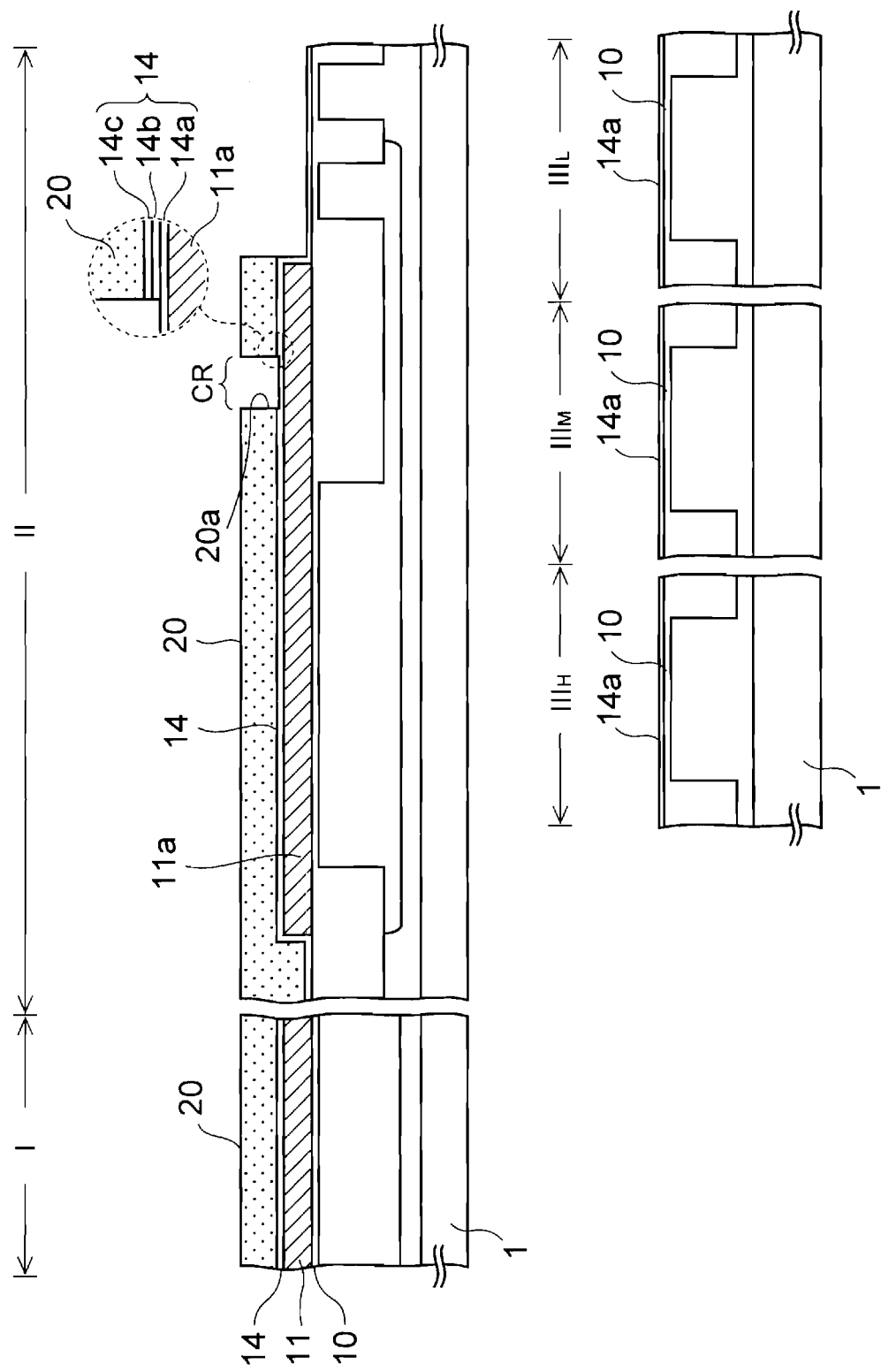

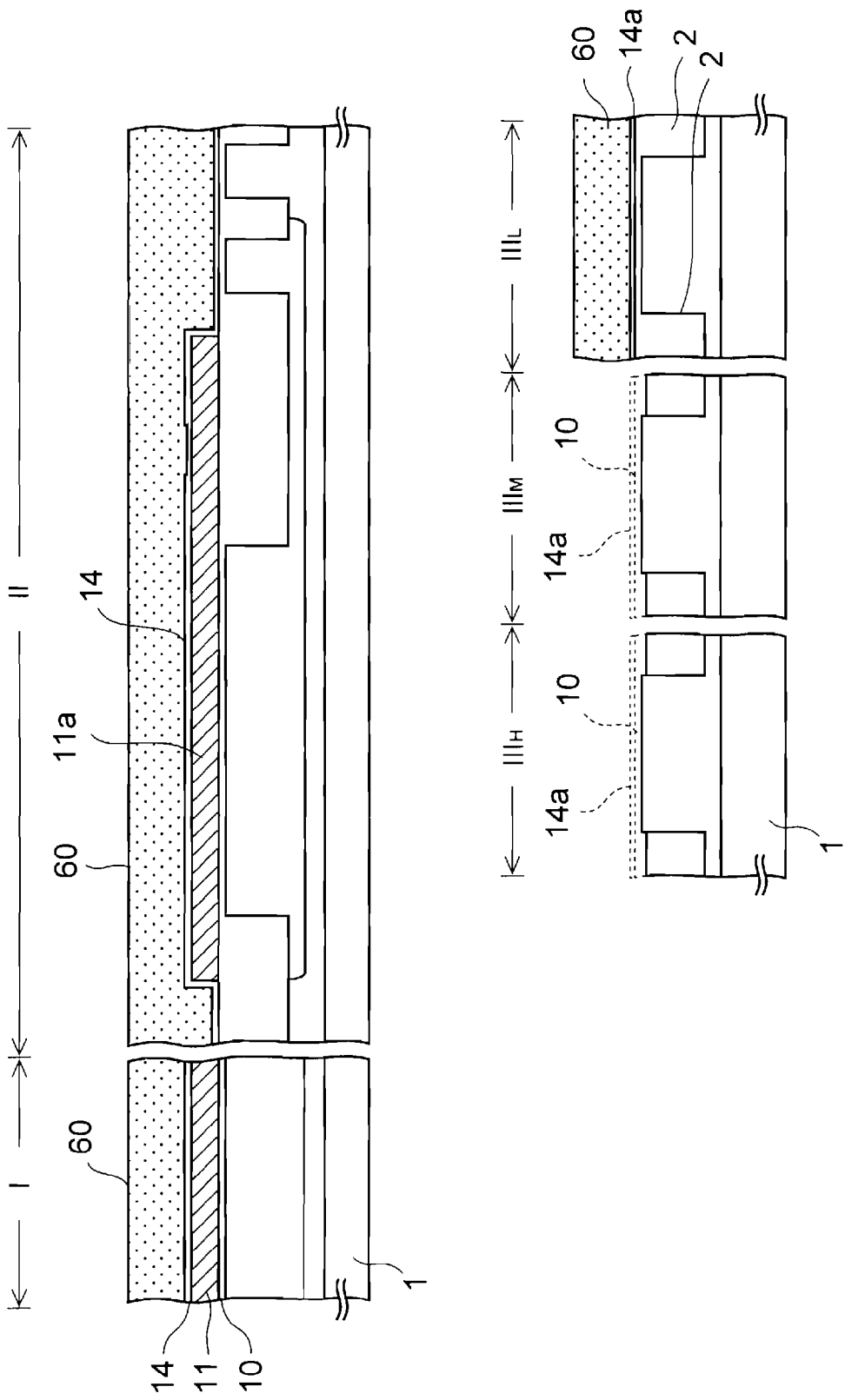

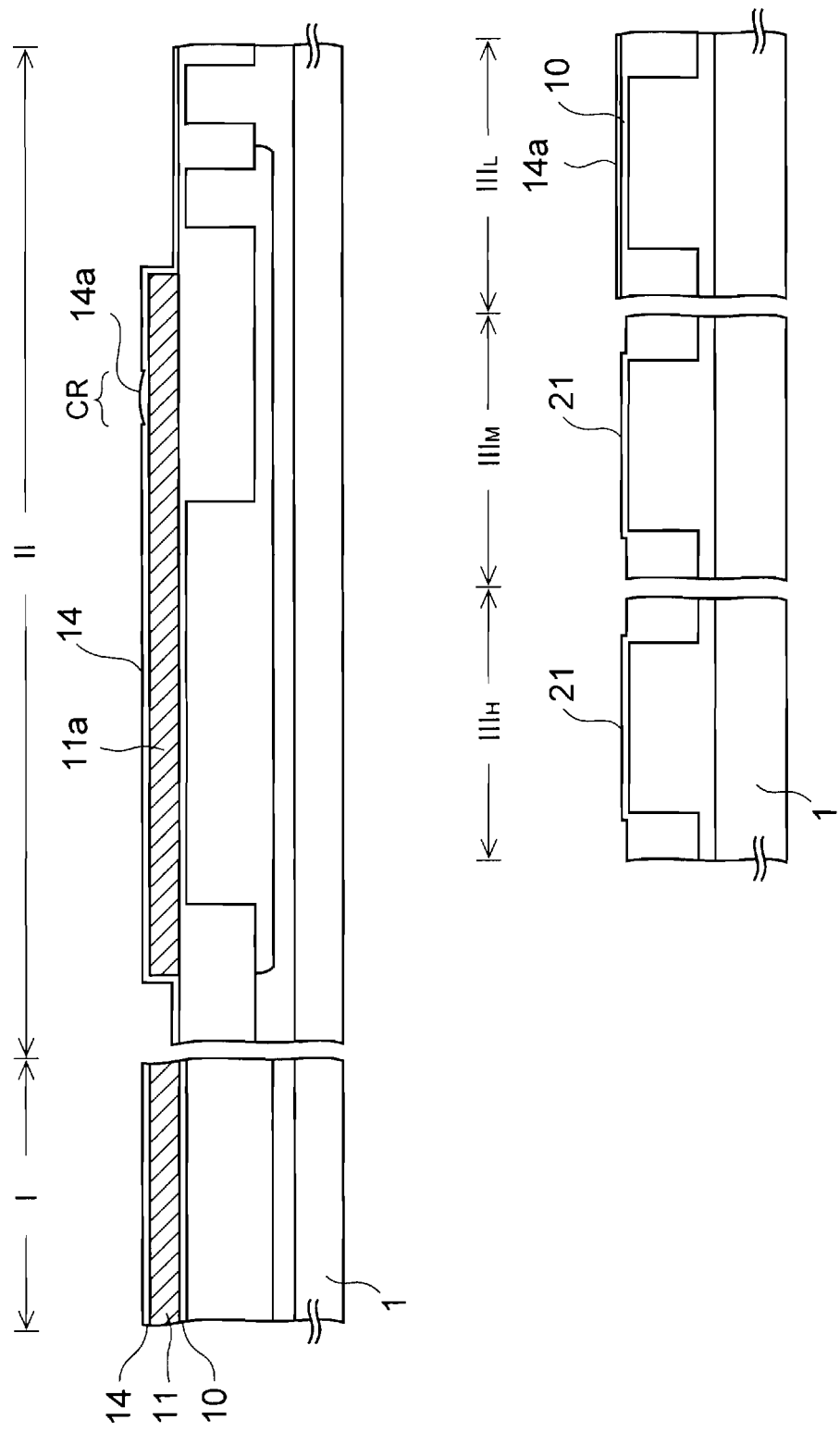

METHOD OF MANUFACTURING SEMICONDUCTOR DEVICE CAPABLE OF REDUCING A SIZE OF THE SEMICONDUCTOR DEVICE

CROSS-REFERENCE TO RELATED APPLICATION

This application is based upon and claims the benefit of priority of the prior Japanese Patent Application No. 2010-177463, filed on Aug. 6, 2010, the entire contents of which are incorporated herein by reference.

FIELD

It is related to a method of manufacturing a semiconductor device.

BACKGROUND

A flash memory, which retains memory even without power, is used not only as a storage medium such as a memory card, but sometimes as a logic embedded memory on which a logic circuit is mixedly mounted.

When a flash memory is mixedly together mounted with a logic circuit as described above, it is preferable to make good use of characteristics of manufacturing processes for the flash memory and those for the logic circuit to thus achieve reduction in size of the logic embedded memory shipped as a product.

Note that, techniques relating to the subject application are disclosed in Japanese Laid-open Patent Publication Nos. 2009-44053, 2006-128508, and 2007-335559.

SUMMARY

According to one aspect discussed herein, there is provided a method of manufacturing a semiconductor device comprising forming a first insulating film in a first region, a second region, and a third region of a semiconductor substrate, forming a flash memory cell including a floating gate, a second insulating film, and a control gate on the first insulating film in the first region, forming a first electrode of a capacitor on the first insulating film in the second region, forming a first silicon oxide film, a silicon nitride film, and a second silicon oxide film in this order as the second insulating film on the first electrode and on the first insulating film in the third region, selectively dry-etching the second insulating film on a partial region of the first electrode to remove the silicon nitride film and the second silicon oxide film with the first silicon oxide film being left, selectively wet-etching and removing the first insulating film and the second insulating film in the third region, forming a third insulating film by subjecting a surface of the semiconductor substrate in the third region to thermal oxidation after the selectively wet-etching and removing the first insulating film and the second insulating film, forming a first gate electrode on the third insulating film, forming a second electrode of the capacitor on a region of the second insulating film on the first electrode other than the partial region, etching and removing the first silicon oxide film in the partial region after forming the second electrode, forming a fourth insulating film in the first region, the second region, and the third region after forming the second electrode and the first gate electrode, forming a hole in the fourth insulating film in the partial region, and forming a conductive plug in the hole.

According to another aspect discussed herein, there is provided a method of manufacturing a semiconductor device including forming a first insulating film in a first region, a second region, and a third region of a semiconductor substrate, forming a first conductive film on the first insulating film in the first region, the second region, and the third region, patterning the first conductive film to form a first electrode of a capacitor in the second region and to remove the first conductive film in the third region with the first conductive film being left in the first region, forming a first silicon oxide film, a silicon nitride film, and a second silicon oxide film in this order as a second insulating film on the first conductive film in the first region, on the first electrode in the second region, and on the first insulating film in the third region, selectively dry-etching the second insulating film on a partial region of the first electrode and in the third region to remove the silicon nitride film and the second silicon oxide film with the first silicon oxide film being left, selectively removing the first insulating film and the first silicon oxide film in the third region, subjecting a surface of the semiconductor substrate in the third region to thermal oxidation to form a third insulating film after removing the first insulating film and the first silicon oxide film, forming a second conductive film on the second insulating film in the first region, on the second insulating film in the second region, and on the third insulating film in the third region, patterning the first conductive film, the second insulating film, and the second conductive film in the first region to form a flash memory cell including a floating gate, the second insulating film, and a control gate, patterning the second conductive film in the second region and the third region to form a second electrode of the capacitor in the second region except for the partial region and to form a first gate electrode in the third region, wet-etching and removing the first silicon oxide film in the partial region after forming the second electrode and the first gate electrode, forming a fourth insulating film in the first region, the second region, and the third region after forming the second electrode and the first gate electrode, forming a hole in the fourth insulating film in the partial region, and forming a conductive plug in the hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 2A to 2K are cross-sectional views in the course of manufacturing a semiconductor device according to an embodiment.

DESCRIPTION OF EMBODIMENTS

An examination performed by the inventors of the subject application is described before the embodiment is described.

Figure 1A:
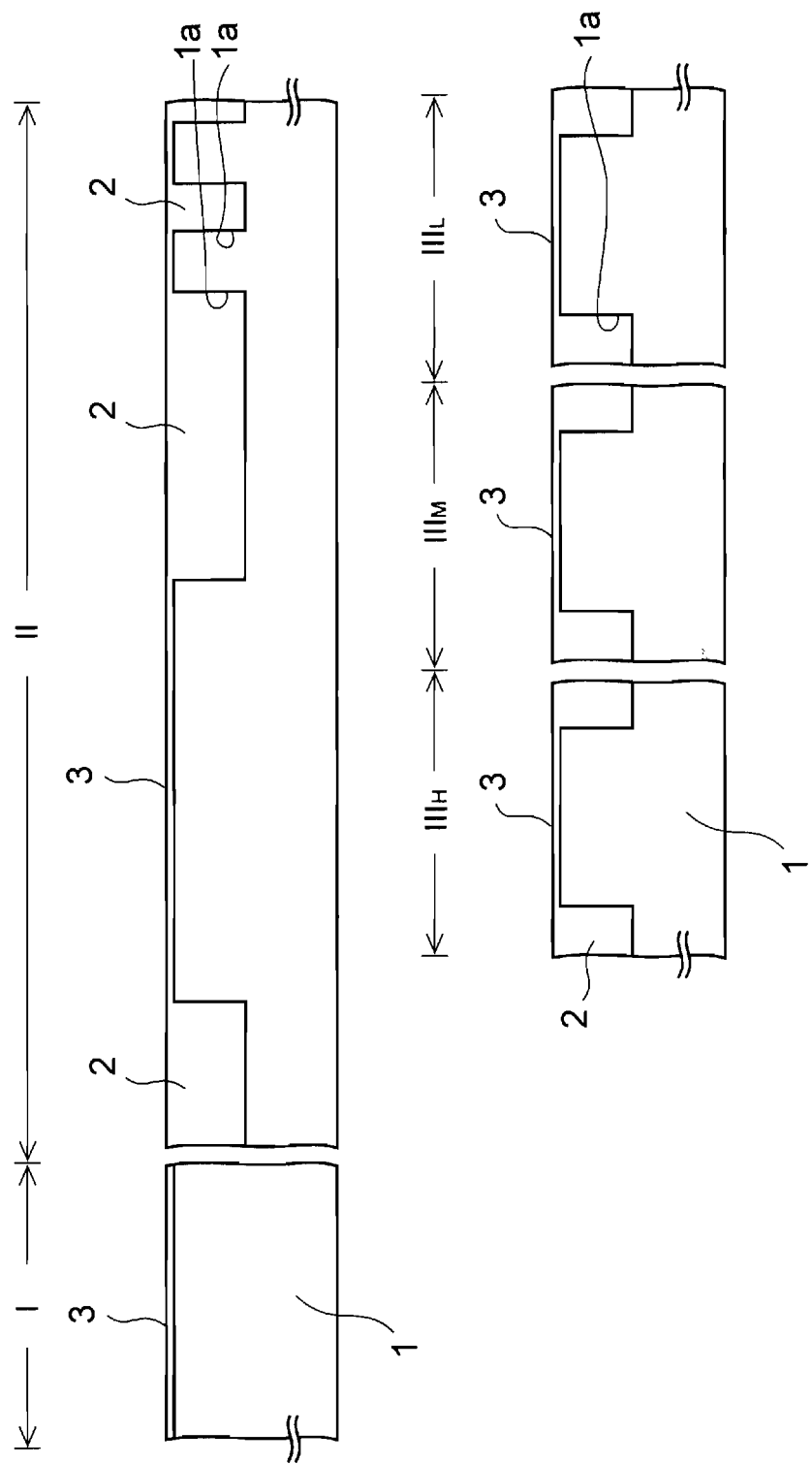
FIGS. 1A to 1W are cross-sectional views in the course of manufacturing a sample which is used for an examination.
Figure 1H:
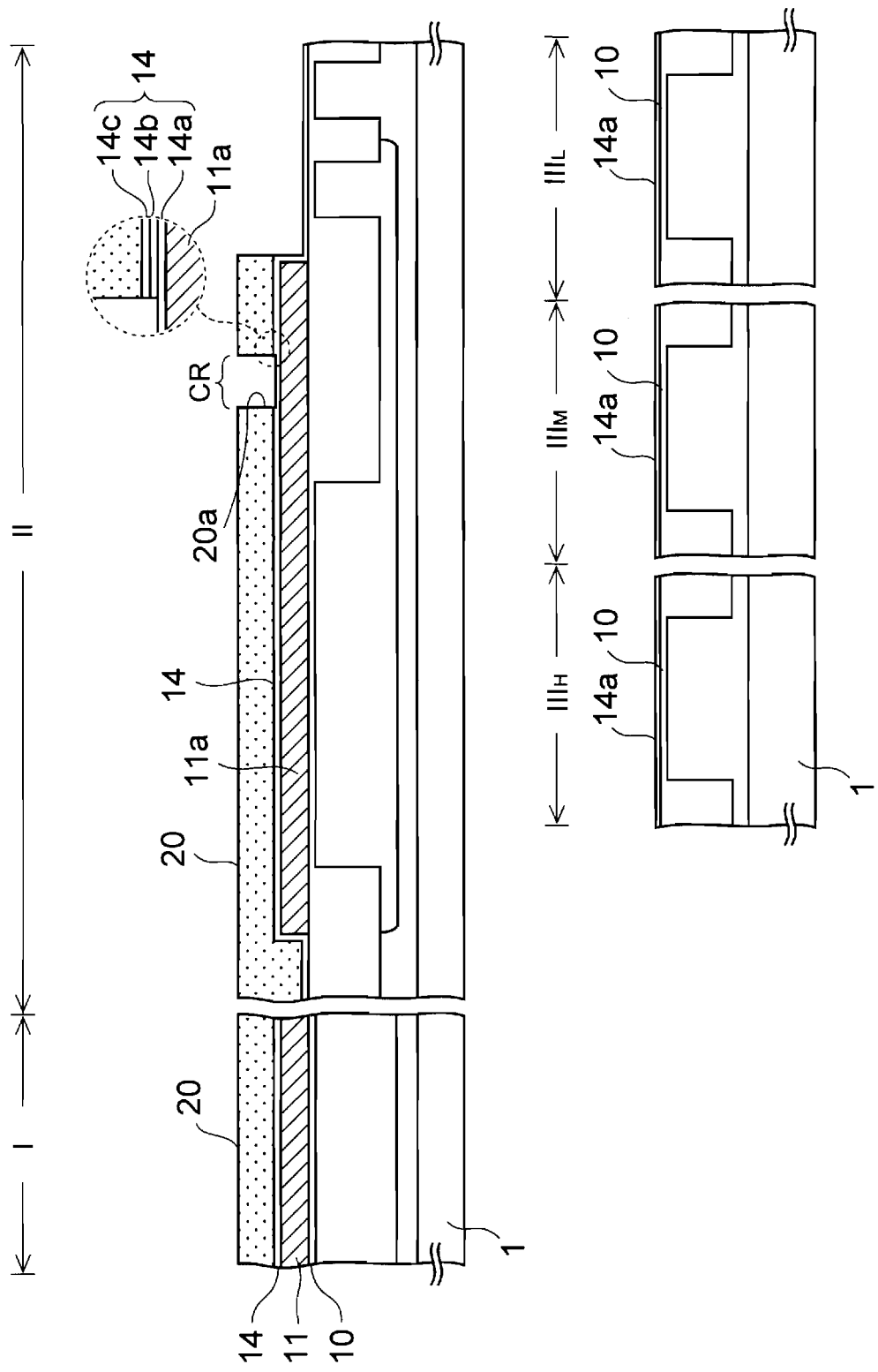
Figure 1I:
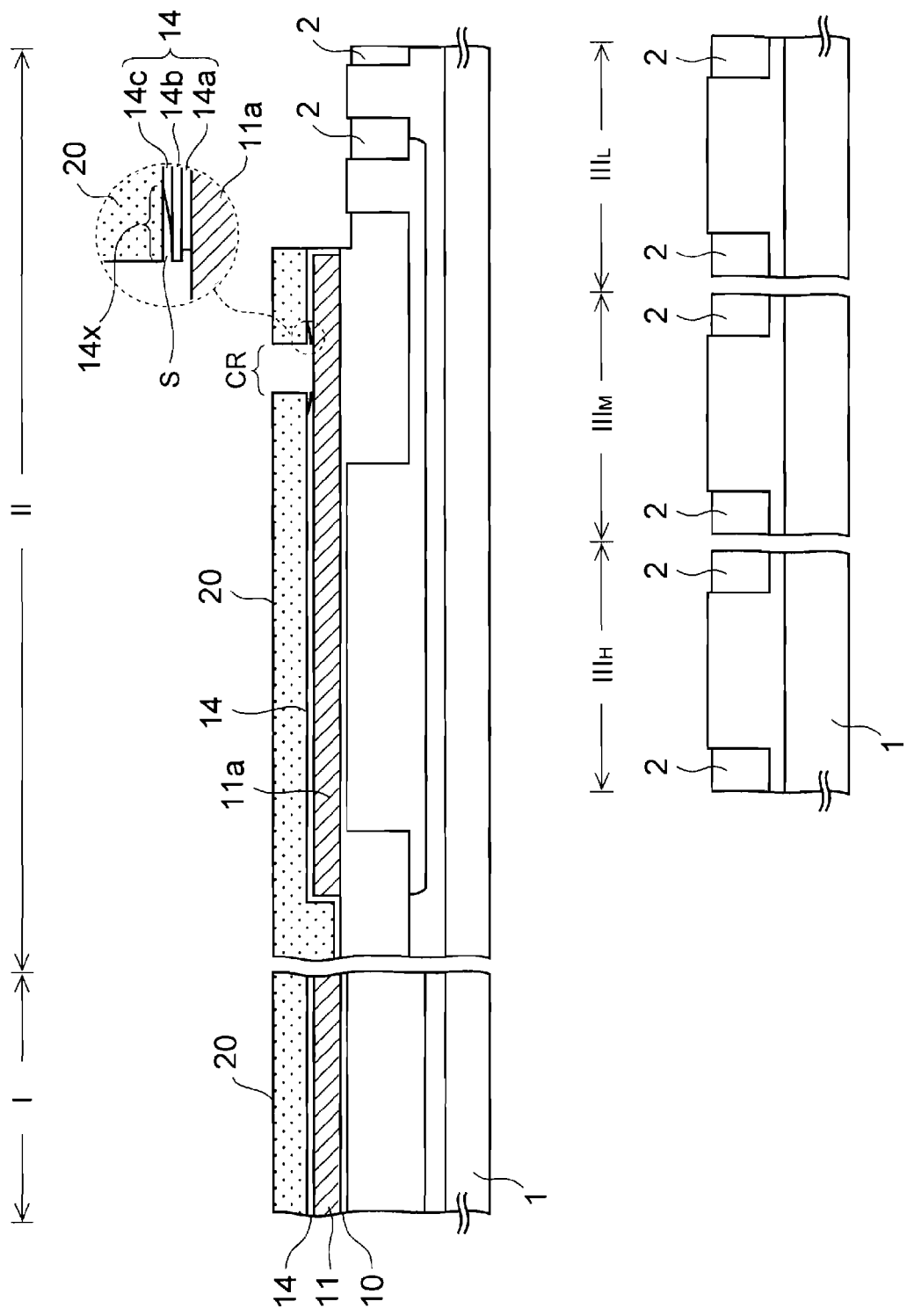
Figure 1J:
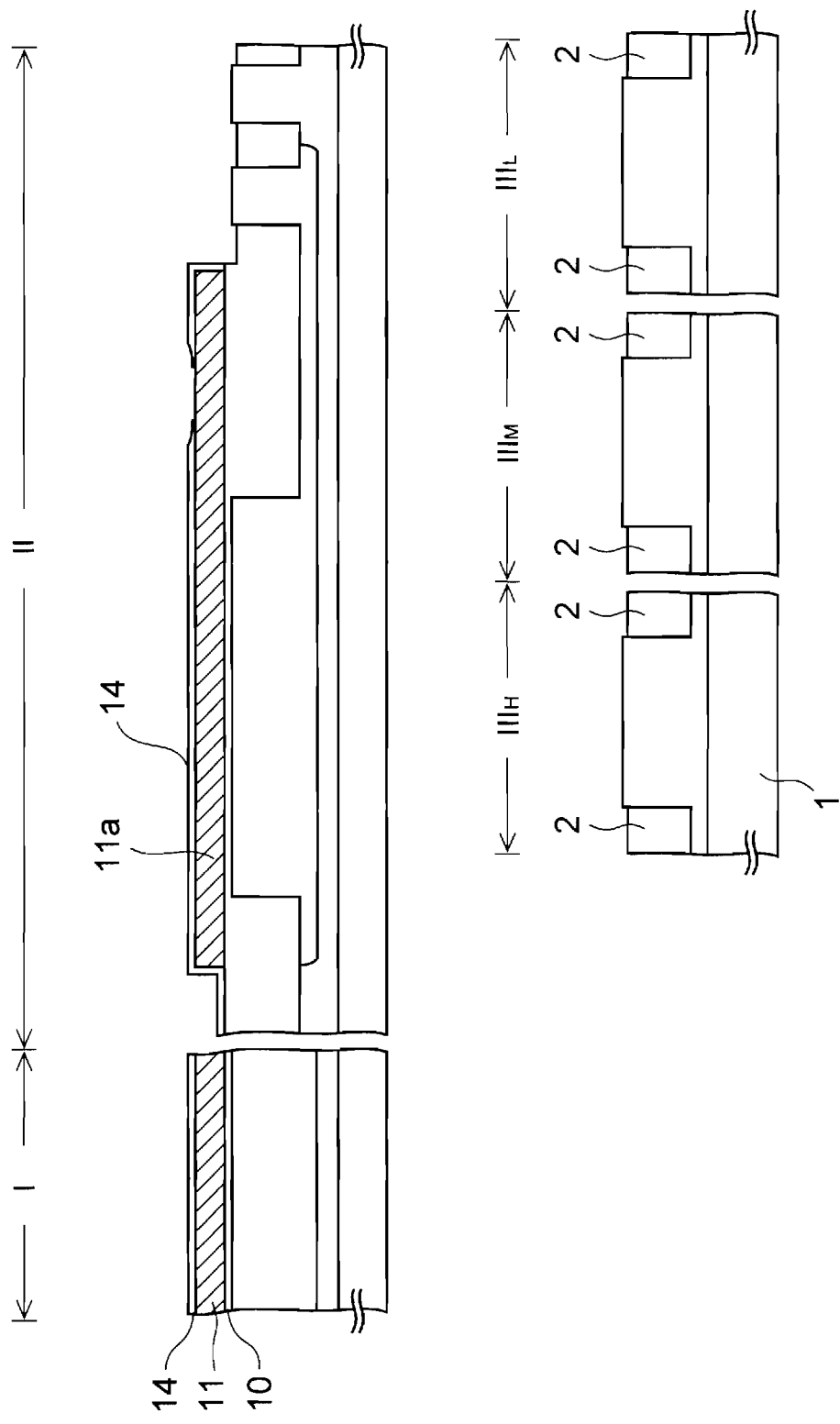
Figure 1K:
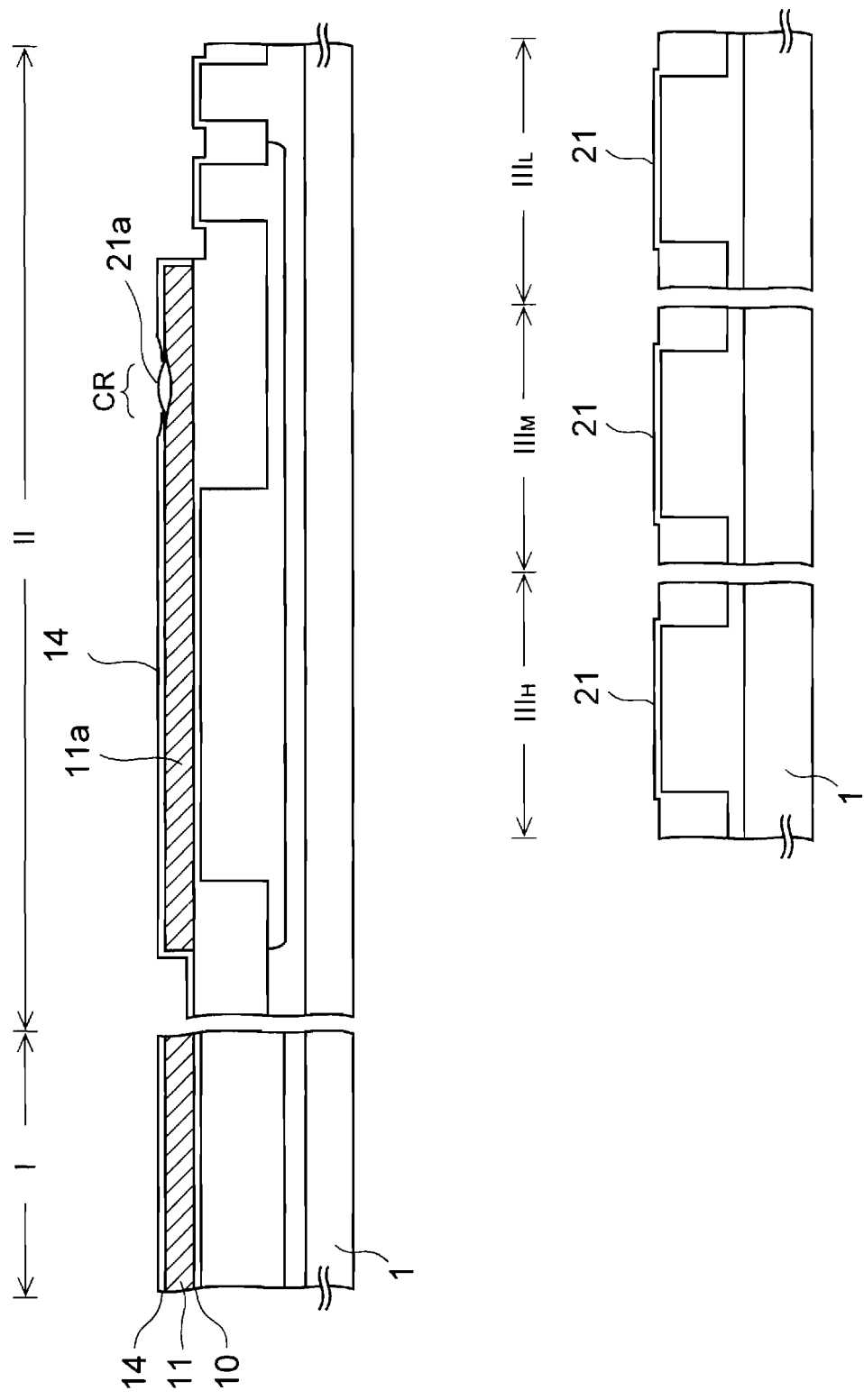
Figure 1N:
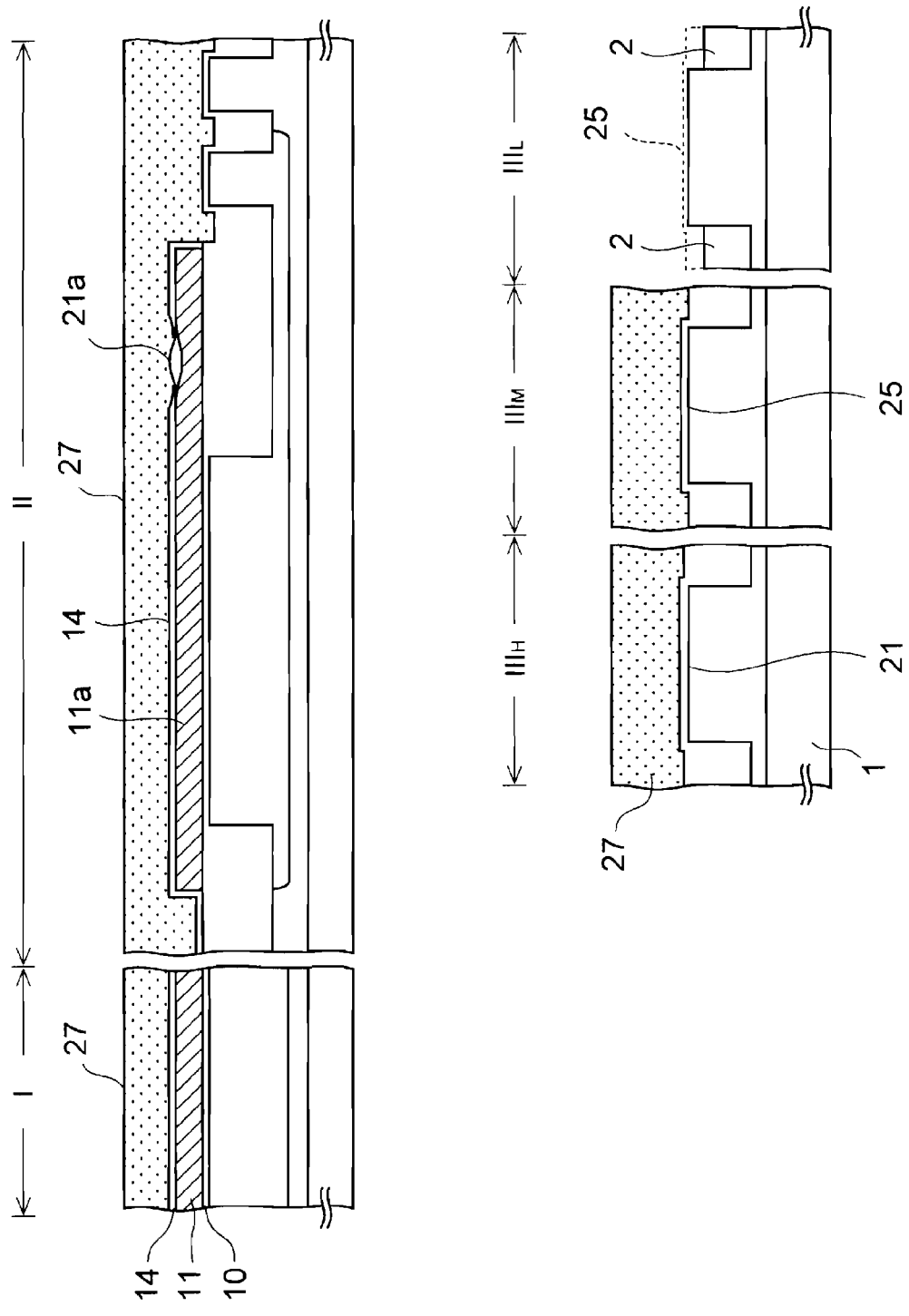
Figure 10:
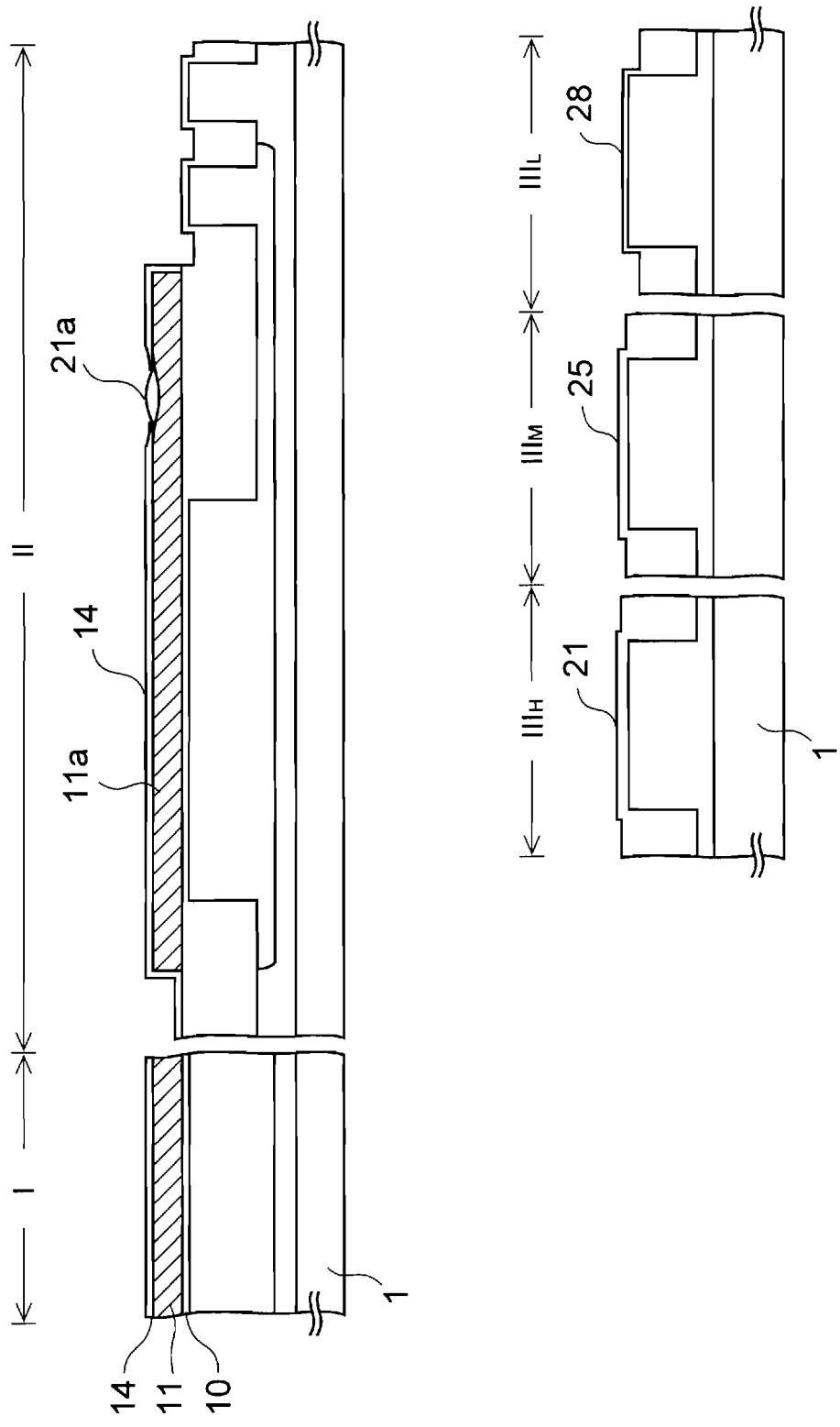
Figure 1Q:
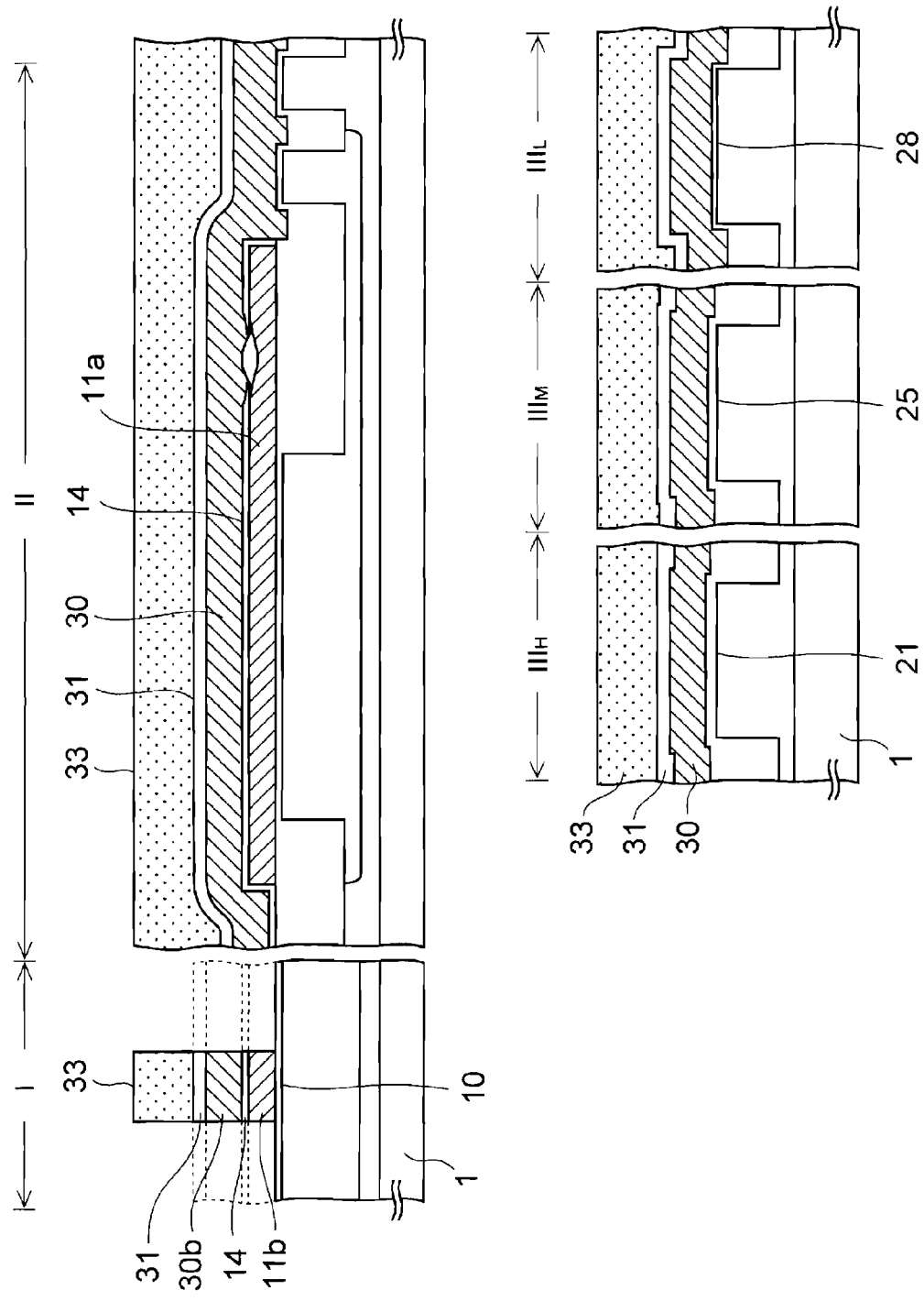
Figure 1R:
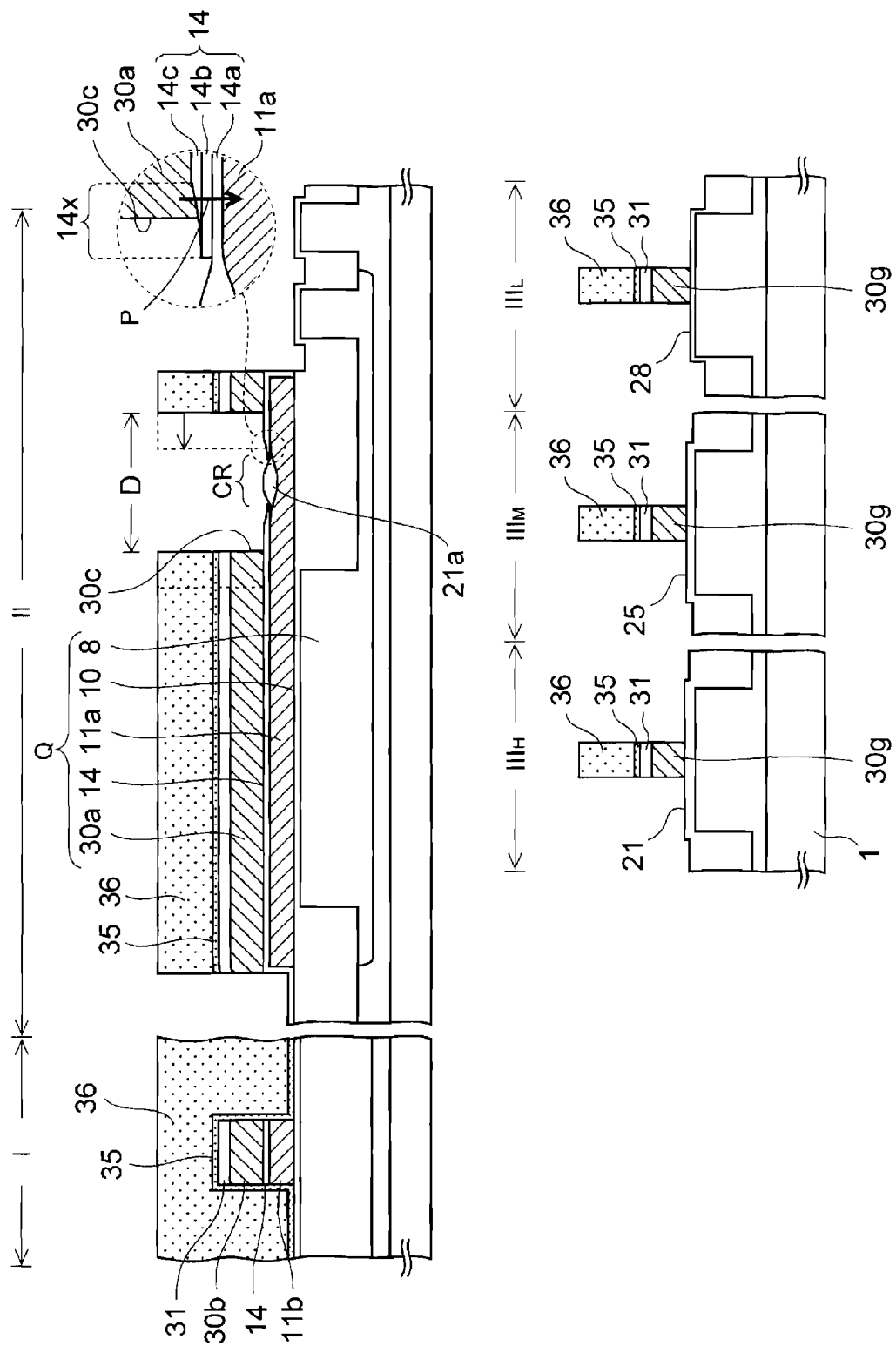
Figure 1T:
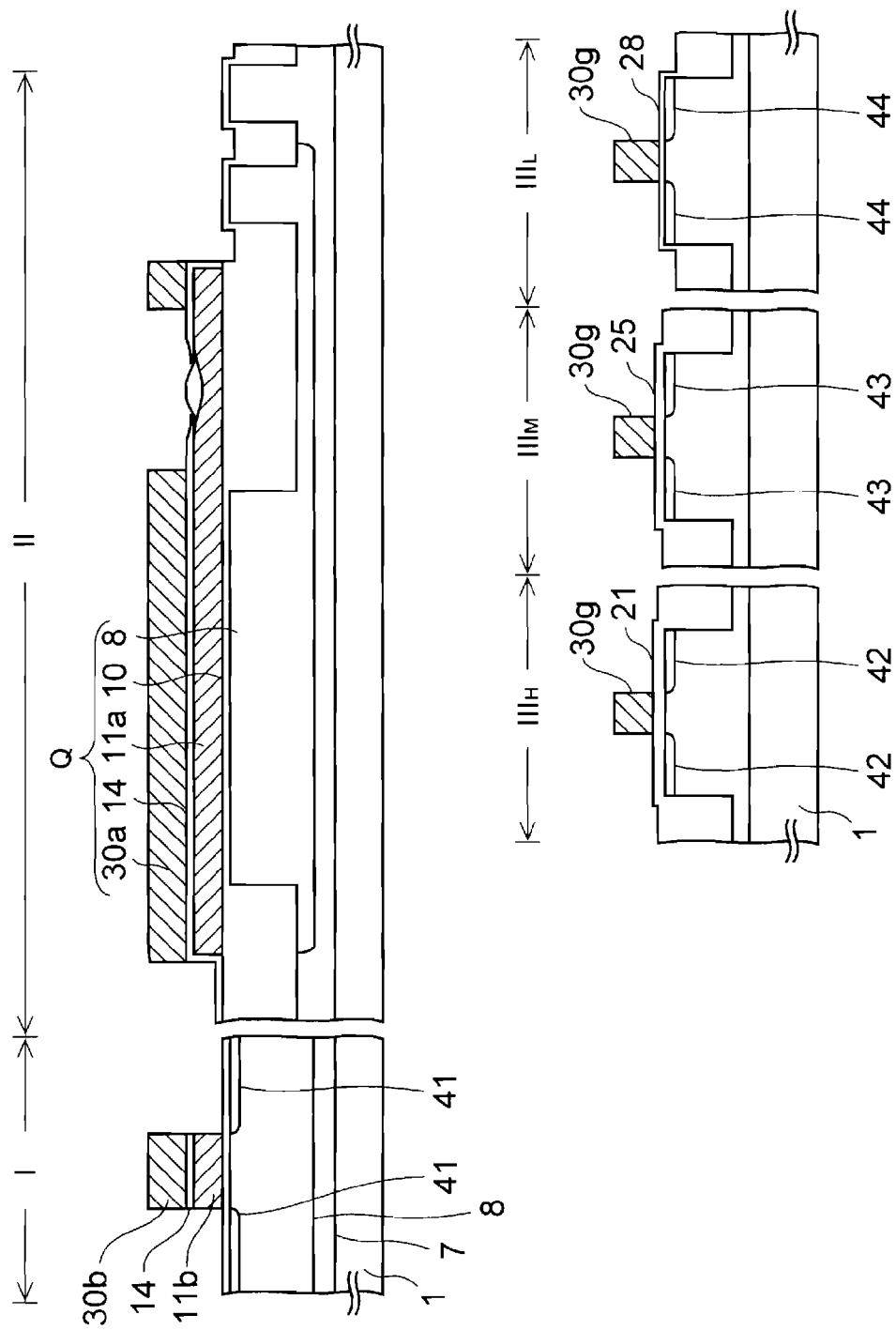
Figure 1U:
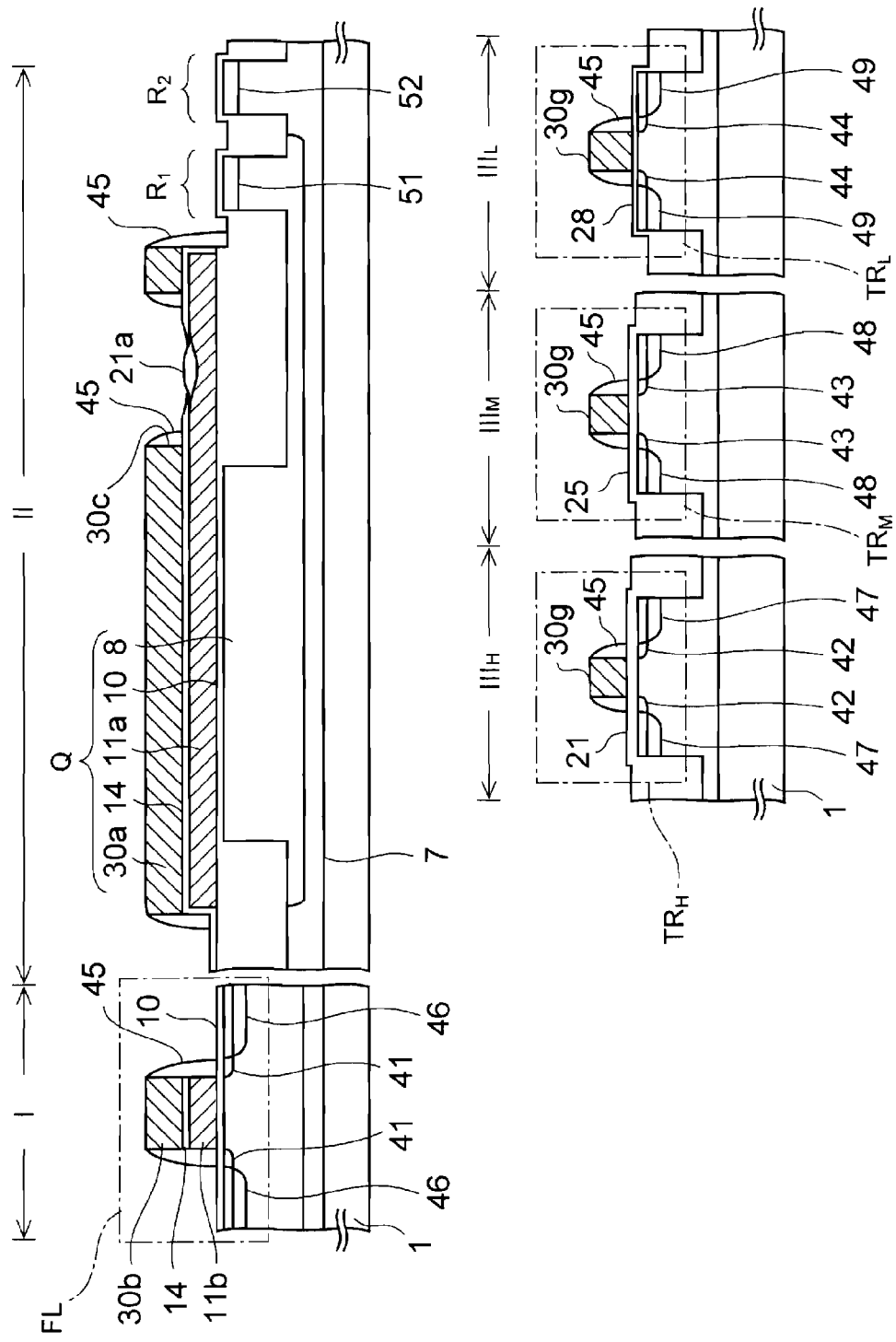
Figure 1V:
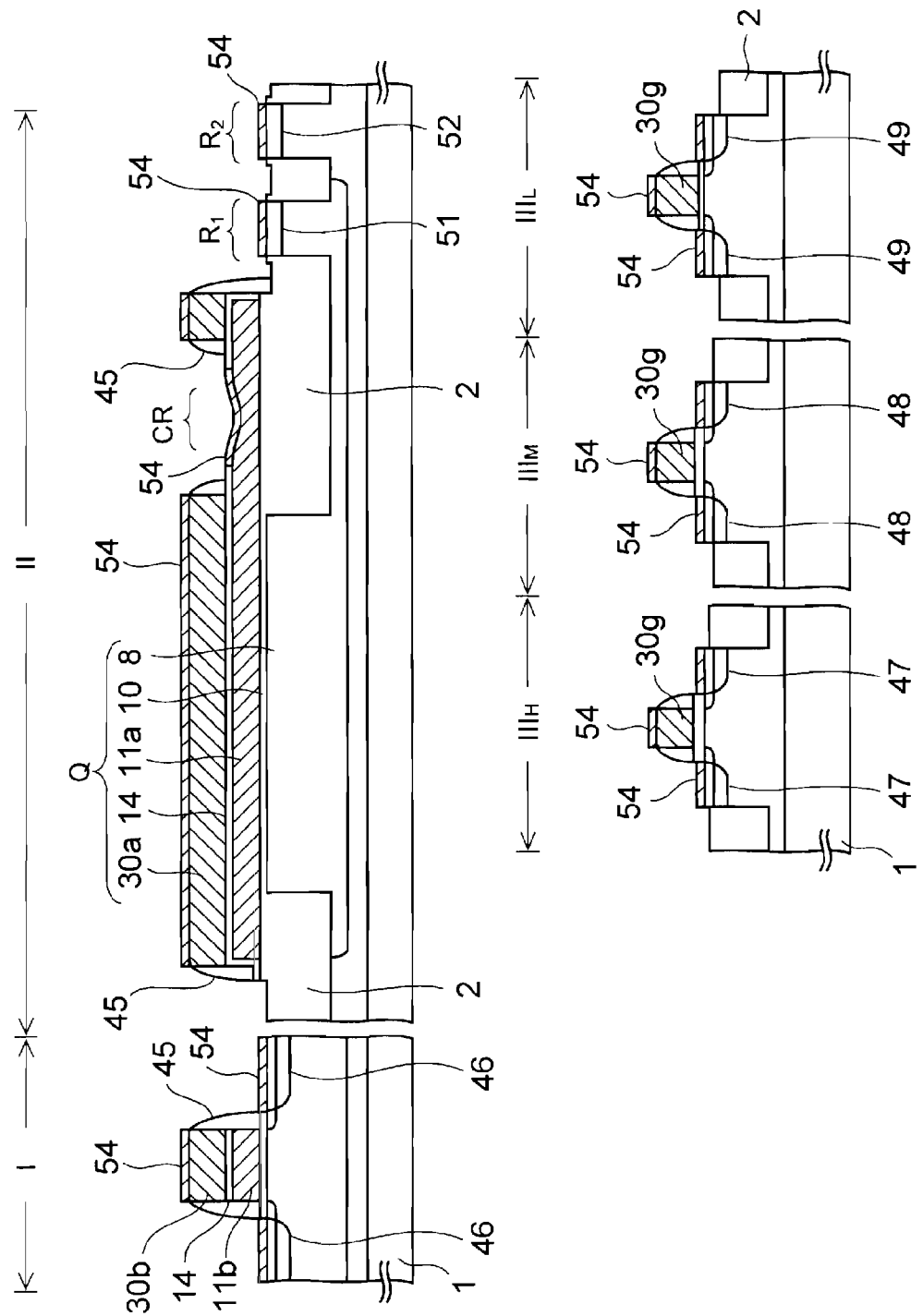
Figure 1W:
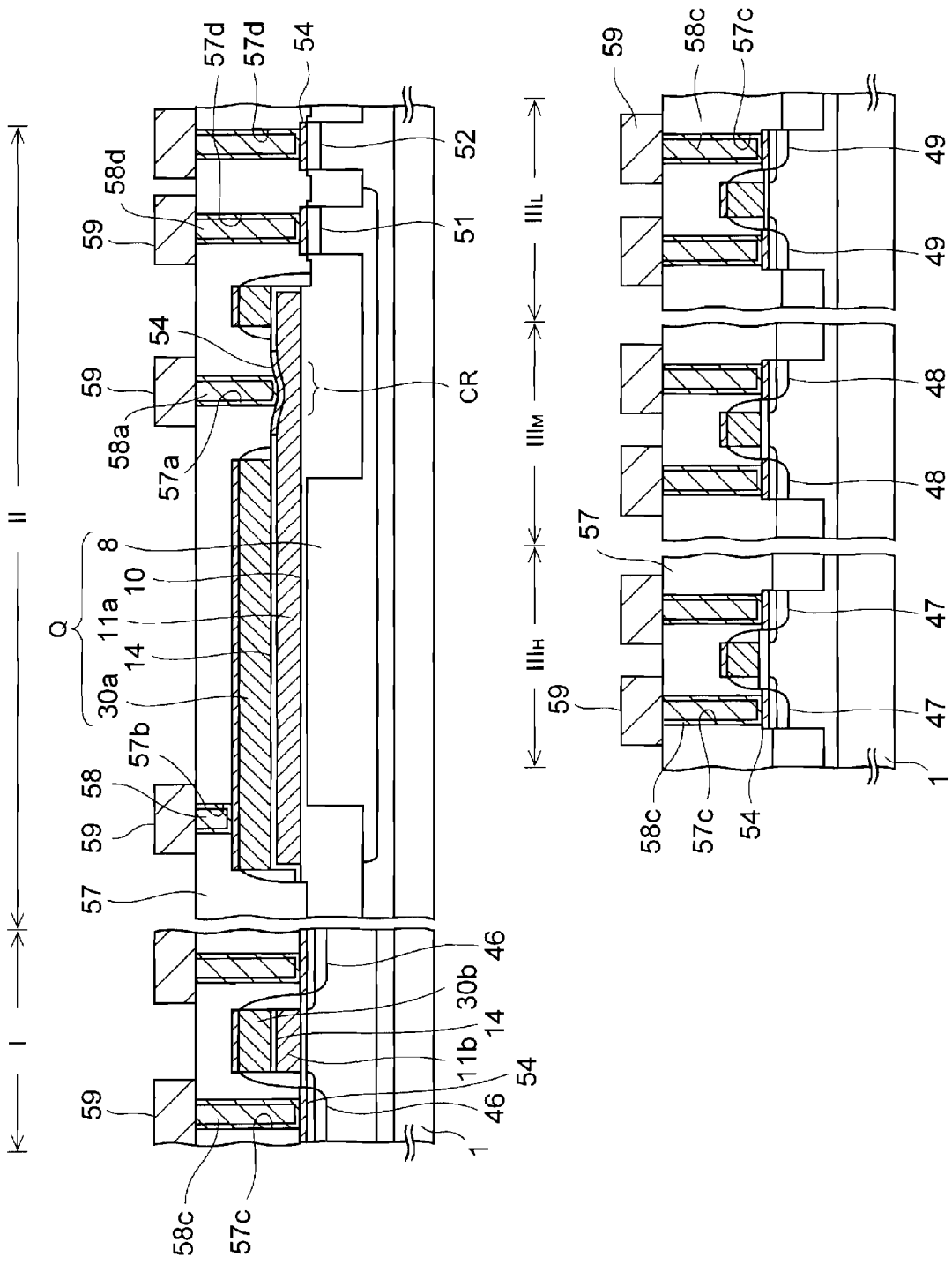

FIGS. 1A to 1W are cross-sectional views in the course of manufacturing a sample which is used for an examination.

The sample is a logic embedded memory in which a flash memory and a logic circuit are mixedly mounted. The sample is manufactured as described below.

Firstly, as illustrated in FIG. 1A, grooves 1a for isolating elements are formed in a silicon substrate 1. A silicon oxide film is embedded in the grooves 1a as an element isolation insulating film 2 by the CVD method. Such element isolation structure is called shallow trench isolation (STI). Local oxidation of silicon (LOCOS) method may be employed instead of STI to isolate the elements from each other.

Then, a thermal oxide film with a thickness of approximately 10 nm is formed as a sacrificial insulating film 3 by subjecting a surface of the silicon substrate 1 to thermal oxidation.

A cell region I in which a flash memory cell is to be formed is demarcated in the silicon substrate 1.

In addition to the cell region I, a capacitor formation region II, a high voltage transistor formation region $III_H$, a middle voltage transistor formation region $III_M$, and a low voltage transistor formation region $III_L$ are demarcated in the silicon substrate 1.

Among them, a capacitor is to be formed later in the capacitor formation region II. The capacitor is used as part of a voltage step-up circuit, and a high voltage generated in the voltage step-up circuit is used for writing data into and erasing data from the flash memory.

Moreover, MOS transistors for use as part of the logic circuit are to be formed in the transistor formation regions $III_H$ to $III_L$, respectively, in the subsequent steps.

Next, as illustrated in FIG. 1B, $P^+$ ions are implanted as an n-type impurity into the silicon substrate 1 with the sacrificial insulating film 3 being used as a through film. Thus, a deep n well 7 is formed in the cell region I and the capacitor formation region II.

Thereafter, a first p well 8 is formed in each of the cell region I, the capacitor formation region II, and the high voltage transistor formation region $III_H$ by implanting ions of a p-type impurity into the silicon substrate 1.

The first p well 8 is formed in a portion at a shallower depth than the n well 7 in the silicon substrate 1, and uses, for example, $B^+$ ions as the p-type impurity.

Note that, the wells 7 and 8 are formed at different portions by using resist patterns not illustrated. After each of the wells 7 and 8 is formed, the resist patterns are removed.

Next, some steps performed to obtain a cross-sectional structure illustrated in FIG. 1C will be described.

Firstly, the sacrificial insulating film 3 being used as the through film in the ion implantation is removed by hydrofluoric acid solution, and a cleaned surface of the silicon substrate 1 is exposed.

Next, the cleaned surface of the silicon substrate 1 is subjected to thermal oxidation in a mixed atmosphere of Ar and $O_2$ and under the condition where a substrate temperature is 900° C. to 1050° C. Thus, a thermal oxide film with a thickness of approximately 10 nm is formed. This oxidation film serves as a first insulating film 10.

Then, a polysilicon film with a thickness of approximately 90 nm is formed as a first conductive film 11 on the first insulating film 10 in the regions I, II, and $III_H$, to $III_L$ by the low-pressure chemical vapor deposition (CVD) method using $SiH_4$ and $PH_3$ as reactant gases. Since $PH_3$ is thus added in the reactant gases, Phosphorus is doped in-situ in the first conductive film 11.

Next, as illustrated in FIG. 1D, photoresist is coated onto the first conductive film 11, and then is exposed to light and developed. Thus, a first mask pattern 13 is formed.

Then, the first conductive film 11 is dry-etched by using the first mask pattern 13 as a mask. Thus, a lower electrode (first electrode) 11a of the capacitor is formed in the capacitor formation region II with the first conductive film 11 remaining in the cell region I. At the same time, the first conductive film 11 in the transistor formation regions $III_H$ to $III_L$ is removed.

An etching gas used in this step is not particularly limited. In this example, a mixed gas of $Cl_2$, HBr, and $CF_4$ is used as the etching gas.

The first mask pattern 13 is removed after this etching is finished.

Next, as illustrated in FIG. 1E, a first silicon oxide film 14a and a silicon nitride film 14b are formed in this order in the regions I, II, and $III_H$ to $III_L$ by the low-pressure CVD method to have thicknesses of approximately 5 nm and 10 nm, respectively. Then, a surface of the silicon nitride film 14b is subjected to thermal oxidation in an $O_2$ atmosphere under a condition in which a substrate temperature is 950° C. and a heating time is for 90 minutes. Thus, a second silicon oxide film 14c with a thickness of approximately 30 nm is formed on the silicon nitride film 14b.

Thus, an ONO film configured by stacking films 14a to 14c is formed as a second insulating film 14 in the regions I, II, and $III_H$ to $III_L$.

The ONO film has a smaller leak current in contrast to a single layer silicon oxide film. Thus, the use of the ONO film as an interlayer insulating film between a floating gate and a control gate of the flash memory cell can prevent charge accumulated in the floating gate from escaping to the control gate.

Next, as illustrated in FIG. 1F, a second p well 18 is formed in the transistor formation regions $III_M$ and $III_L$ of the silicon substrate 1 with the first insulating film 10 and the second insulating film 14 in the regions $III_M$ and $III_L$ being used as through films. In this ion-implantation, $B^+$ ions are used as a p-type impurity.

Next, as illustrated in FIG. 1G, photoresist is coated onto the second conductive film 14, and then is exposed to light and developed. Thus, a second mask pattern 20 is formed.

The second mask pattern 20 is formed to cover the cell region I, and includes a window 20a above a contact region CR of the lower electrode 11a.

Note that, the second insulating film 14 in the transistor formation regions $III_H$ to $III_L$ is not covered with the second mask pattern 20, and is thus exposed.

Next, as illustrated in FIG. 1H, the second insulating film 14 above the contact region CR of the lower electrode 11a and in the transistor formation regions $III_H$ to $III_L$ is dry-etched by using the second mask pattern 20 as a mask.

The dry etching is performed in two steps.

In the first step, the second silicon oxide film 14c being the uppermost layer of the second insulating film 14 is etched by using a mixed gas of $C_4F_8$ and Ar as an etching gas.

In the second step, the etching gas is switched to a mixed gas of $CH_3F$ and $O_2$ to etch the silicon nitride film 14b. By this etching gas, the first silicon oxide film 14a is etched at the slower speed than the silicon nitride film 14b is etched. Thus, the first silicon oxide film 14a serves as an etching stopper in this etching, and the etching stops at an upper surface of the first silicon oxide film 14a.

Leaving the first silicon oxide film 14a in this manner can prevent the surface of the silicon substrate 1 in the transistor formation regions $III_H$ to $III_L$ from being exposed to the etching gas having turned into plasma, and thus prevent the surface from being damaged by the plasma.

Next, as illustrated in FIG. 1I, the first silicon oxide film 14a at portions which are not covered with the second mask pattern 20 is removed by wet etching using hydrofluoric acid solution.

Thus, a surface of the lower electrode 11a is exposed in the contact region CR, and the surface of the silicon substrate 1 is also exposed in the transistor formation regions $III_H$ to $III_L$.

Moreover, exposing the surface of the silicon substrate 1 by wet etching as described above can prevent the surface of the silicon substrate 1 from being damaged by plasma of an etching gas, which would otherwise occur in the case of dry etching.

However, in the wet etching, there is a case where the hydrofluoric acid solution enters an interface S between the second insulating film 14 and the second mask pattern 20 as illustrated in a dotted circle of FIG. 1I. In this case, there is a risk that the second silicon oxide film 14c being the uppermost layer of the second insulating film 14 is etched by the hydrofluoric acid solution.

When the second silicon oxide film 14c is etched, the film thickness of the second insulating film 14 becomes thinner in a portion close to the contact region CR, at which a thin portion 14x of the second insulating film 14 is formed.

Thereafter, the second mask pattern 20 is removed as illustrated in FIG. 1J.

Hereinafter, steps are performed for forming insulating films, which are used as gate insulating films and having different thicknesses from each other, in the transistor formation regions $III_H$ to $III_L$, respectively.

To form the gate insulating films, first, as illustrated in FIG. 1K, a thermal oxide film is formed as a third insulating film 21 by subjecting the surface of silicon substrate 1 in the transistor formation regions $III_H$ to $III_L$ to thermal oxidation.

The thickness of the third insulating film 21 is not limited. In this example, the third insulating film 21 is formed to a thickness of approximately 9.5 nm. Moreover, an oxidation condition is not particularly limited. In this example, the thermal oxidation is performed in an $O_2$ atmosphere under the condition where a substrate temperature is approximately 850° C.

Note that, this thermal oxidation results in oxidization of the surface of the lower electrode 11a in the contact region CR to thereby form a thermal oxide film 21a.

Next, as illustrated in FIG. 1L, photoresist is coated onto the entire upper surface of the silicon substrate 1, and is exposed to light and developed. Thus, a third mask pattern 23 covering the regions I, II, and $III_H$ is formed.

Note that, the third insulating film 21 in the middle voltage transistor formation region $III_M$ and the low voltage transistor formation region $III_L$ is not covered with the third mask pattern 23, and is thus exposed.

Then, the third insulating film 21 in the regions $III_M$ and $III_L$ is removed by wet etching using hydrofluoric acid solution as an etchant with use of the third mask pattern 23 as a mask. Thus, the surface of the silicon substrate 1 is exposed in the regions $III_M$ and $III_L$.

Thereafter, the third mask pattern 23 is removed.

Next, as illustrated in FIG. 1M, the surface of the silicon substrate 1 in the regions $III_M$ and $III_L$ is subjected to thermal oxidation in an $O_2$ atmosphere under an oxidation condition in which a substrate temperature is approximately 850° C. Thus, a thermal oxide film with a thickness of approximately 6.0 nm is formed as a fourth insulating film 25 in the regions $III_M$ and $III_L$.

Subsequently, as illustrated in FIG. 1N, photoresist is coated onto the entire upper surface of the silicon substrate 1. Then, the photoresist is exposed to light and developed to thus form a fourth mask pattern 27 covering the regions I, II, $III_H$, and $III_M$ and exposing the low voltage transistor formation region $III_L$.

Thereafter, the fourth insulating film 25 in the low voltage transistor formation region $III_L$ is removed by wet-etching using hydrofluoric acid solution as an etchant with use of the fourth mask pattern 27 as a mask.

The fourth mask pattern 27 is removed after this etching is finished.

Next, as illustrated in FIG. 1O, a thermal oxide film is formed on the surface of the silicon substrate 1 which is exposed in the low voltage transistor formation region $III_L$. The thermal oxide film serves as a fifth insulating film 28.

An oxidation condition in this step is not particularly limited. In this example, the fifth insulating film 28 is formed to a thickness of approximately 1.8 nm in an $O_2$ atmosphere under an oxidation condition in which a substrate temperature is approximately 850° C.

By performing the steps described above, the insulating films 21, 25, and 28 are formed in the transistor formation regions $III_H$ to $III_L$ of the silicon substrate 1, respectively, and the film thickness becomes smaller in the order of the insulating films 21, 25, and 28.

As described later, these insulating films 21, 25, and 28 serve as gate insulating films of the transistors, and are set to thicknesses corresponding to the drive voltages of the transistors in the regions $III_H$ to $III_L$, respectively.

Next, as illustrated in FIG. 1P, a non-doped polysilicon film with a thickness of approximately 180 nm is formed as a second conductive film 30 on the entire upper surface of the silicon substrate 1 by the low pressure CVD method using $SiH_4$ as a reactant gas.

Then, a hard mask 31 is formed on the second conductive film 30. For example, a silicon oxide film is formed as the hard mask 31 by the CVD method using TEOS gas as a reactant gas.

Next, as illustrated in FIG. 1Q, a resist pattern is formed as a fifth mask pattern 33 on the hard mask 31.

Thereafter, the hard mask 31 in the cell region I is dry-etched by using the fifth mask pattern 33 as a mask to have a strip-like planar shape corresponding to the control gate.

Furthermore, the first conductive film 11, the second insulating film 14, and the second conductive film 30 are dry-etched by using the hard mask 31 and the fifth mask pattern 33 as a mask. Thus, a floating gate 11b and a control gate 30b are formed in the cell region I.

In the dry-etching, a mixed gas of $Cl_2$ and $O_2$ is used an etching gas for the first and second conductive films 11 and 30 which include polysilicon. Meanwhile, a mixed gas of $CH_3$ and $O_2$ is used as an etching gas for the ONO film as the second insulating film 14.

Thereafter, the fifth mask pattern 33 is removed.

Next, a step performed to obtain a cross-sectional structure illustrated in FIG. 1R will be described.

Firstly, an anti-reflection film 35 is formed on the entire upper surface of the silicon substrate 1. The anti-reflection film 35 is also called bottom anti reflection coating (BARC), and can be formed by coating an organic material on the entire upper surface of the silicon substrate 1 by the spin coating method.

Next, photoresist is coated onto the anti-reflection film 35, and is exposed to light and developed to thus form a sixth mask pattern 36. When the photoresist is exposed to light, the anti-reflection film 35 is formed as a ground in advance as described above to thereby suppress reflection of the exposure light by the hard mask 31 or the second conductive film 30. Thus, the sixth mask pattern 36 can be accurately formed.

Thereafter, the hard mask 31 is dry-etched by using the sixth mask pattern 36 as a mask.

By this dry-etching, the hard mask 31 is patterned into a shape of a gate electrode in each of the transistor formation regions $III_H$ to $III_L$, and is patterned into a shape of an upper electrode of a capacitor in the capacitor formation region II.

Thereafter, the second conductive film 30 in the regions II and $III_H$ to $III_L$ is dry-etched using a mixed gas of $Cl_2$ and $O_2$ as an etching gas with the sixth mask pattern 36 and the hard mask 31 being used as masks.

By this dry-etching, a gate electrode 30g is formed in each of the transistor formation regions $III_H$ to $III_L$.

Meanwhile, an upper electrode (second electrode) 30a is formed in the capacitor formation region II. It completes a basic structure of a capacitor Q which includes the upper electrode 30a, the second insulating film 14, the lower electrode 11a, the first insulating film 10, and the first p well 8.

In the capacitor Q, the electrodes 11a and 30a and the first p well 8 function as capacitor electrodes. Moreover, the first insulating film 10 between the first p well 8 and the electrode 11a as well as the second insulating film 14 between the electrodes 11a and 30a function as capacitance insulating films. Such capacitor Q is called a stacked gate capacitor.

Note that, a capacitor may be formed only with the electrodes 11a and 30a and the second insulating film 14 therebetween.

As described above, the capacitor Q serves as part of the voltage step-up circuit for generating a high voltage to be used in the flash memory cell.

Furthermore, an opening 30c is formed in the upper electrode 30a in the contact region CR, and the thermal oxide film 21a is exposed from the opening 30c.

As described later, a conductive plug is to be connected to the contact region CR of the lower electrode 11a. The opening 30c is formed to prevent the conductive plug and the upper electrode 30a from being brought into contact with each other.

A diameter D of the opening 30c is preferably made as small as possible from the viewpoint of increasing the capacitance of the capacitor Q by increasing the areas of the respective electrodes 11a and 30a which are opposed to each other.

However, if the diameter D is made small, there is a disadvantage as follows. Specifically, when the sixth mask pattern 36 is misaligned with respect to the second insulating film 14 as indicated by an arrow, an inner surface of the opening 30c is positioned above the thin portion 14x of the second insulating film 14 as illustrated in a dotted circle.

In such case, a leak current P flows between the lower electrode 11a and the upper electrode 30a in the thin portion 14x where the withstanding voltage is relatively low in the second insulating film 14. Thus, the reliability of the semiconductor device is reduced.

For this reason, it is necessary to enlarge the diameter D in this example so as not to position the inner surface of the opening 30c on the thin portion 14x even when a displacement occurs as described above. Furthermore, in order to compensate for reduction of the opposite areas between the electrodes 11a and 30a, which is caused due to enlargement of the diameter D, it is necessary to widen the horizontal sizes of the electrodes 11a and 30a. Thus, it is necessary to enlarge the capacitor formation region II.

Thereafter, as illustrated in FIG. 1S, the hard mask 31 and the sixth mask pattern 36 are removed.

Next, as illustrated in FIG. 1T, ions of an n-type impurity such as $As^+$ ions is implanted into the silicon substrate 1 in the regions I, and $III_H$ to $III_L$ with the floating gate 11b and the gate electrodes 30g being used as masks. Thus, first to fourth source/drain extensions 41 to 44 are formed.

Next, a step performed to obtain a cross-sectional structure illustrated in FIG. 1U will be described.

Firstly, an insulating film is formed on the entire upper surface of the silicon substrate 1. Then, the insulating film is etched back to remain on sides of the floating gate 11b and the gate electrodes 30g as insulating sidewalls 45. As the insulating film, for example, a silicon oxide film is formed by the CVD method using TEOS gas.

Note that, the insulating films 10, 21, 25 and 28 which are formed by subjecting the silicon substrate 1 to thermal oxidation each have a higher density than the insulating sidewalls 45 formed by using the TEOS gas. Thus, the insulating films 10, 21, 25 and 28 are not completely removed in the etching back described above, and are left on the silicon substrate 1.

Next, p-type impurities are introduced into the silicon substrate 1 by being implanted with the insulating sidewalls 45, the floating gate 11b, and the gate electrodes 30g being used as masks. Thus, first to fourth source/drain regions 46 to 49 are formed in the silicon substrate 1 at both sides of the floating gate 11b and the respective gate electrodes 30b, 30g.

Then, p-type impurities and n-type impurities are ion-implanted into first and second well contact regions $R_1$ and $R_2$ in the capacitor formation region II, respectively. Thus, a p-type impurity diffusion region 51 and an n-type impurity diffusion region 52 are formed.

Note that, the n-type impurities and the p-type impurities are shot into different portions by using resist patterns not illustrated. After the ion implantation is completed, the resist patterns are removed.

By performing the steps described above, a basic structure of a flash memory cell FL including the floating gate 11b, the second insulating film 14, and the control gate 30b is completed in the cell region I.

In the flash memory cell FL, the first insulating film 10 serves as a tunnel insulating film. Furthermore, information is written by supplying electrons from the first source/drain region 46 to the floating gate 11b through the first insulating film 10.

Meanwhile, basic structures of a high voltage MOS transistor $TR_H$, a middle voltage MOS transistor $TR_M$, and a low voltage MOS transistor $TR_L$ each of which includes the gate electrode 30g and the like are completed in the transistor formation regions $III_H$ to $III_L$, respectively.

The transistors $TR_H$, $TR_M$, and $TR_L$ have the respective drive voltages which become lower in this order in accordance with the thicknesses of the insulating films 21, 25, and 28 functioning as gate insulating films.

Next, as illustrated in FIG. 1V, the entire upper surface of the silicon substrate 1 is exposed to hydrofluoric acid solution. Thus, the insulating films 10, 21, 25, and 28 on the source/drain regions 46 to 49 are removed, and a cleaned surface of the silicon substrate 1 is exposed.

At this time, the contact region CR of the lower electrode 11a is also exposed to the hydrofluoric acid solution, and the thermal oxide film 21a is removed.

Then, a refractory metal film such as a cobalt film is formed on the entire upper surface of the silicon substrate 1 by the sputtering method. Thereafter, the refractory metal film is annealed to react with silicon, and a refractory metal silicide layer 54 is formed on the source/drain regions 46 to 49.

Thereafter, unreacted portions of the refractory metal film on the element isolation insulating film 2 and the insulating sidewalls 45 are removed by wet-etching.

The refractory metal silicide layer 54 is formed on upper surfaces of the control gate 30b and the respective gate electrodes 30g, as well. Thus, these gates become less resistive.

Furthermore, the refractory metal silicide layer 54 is formed in the contact region CR of the lower electrode 11a, as well.

Next, a step performed to obtain a cross-sectional structure illustrated in FIG. 1W will be described.

First, a silicon oxide film is formed as a sixth insulating film 57 on the entire upper surface of the silicon substrate 1 by the CVD method. Thereafter, an upper surface of the sixth insulating film 57 is polished and flattened by the CMP method.

Then, the sixth insulating film 57 is patterned by photolithography and etching. Thus, a first hole 57a and a second hole 57b are formed above the contact region CR of the lower electrode 11a and above the upper electrode 30a, respectively.

Moreover, in this patterning, third holes 57c are formed in the sixth insulating film 57 in the cell region I and the transistor formation regions $III_H$ to $III_L$. In addition, fourth holes 57d are formed in the sixth insulating film 57 above the impurity diffusion regions 51 and 52.

Thereafter, the first to fourth conductive plugs 58a to 58d are formed in the holes 57a to 57d, respectively.

The conductive plugs 58a to 58d are formed as follows. Firstly, a titanium film and a titanium nitride film as glue films are formed in this order by the sputtering method on inner surfaces of the holes 57a to 57d and on an upper surface of the sixth insulating film 57. Then, a tungsten film is formed on the glue films by the CVD method, so that the holes 57a to 57d are completely filled with the tungsten film. Thereafter, excessive portions of the glue films and the tungsten film on the sixth insulating film 57 are polished and removed by the CMP method. These films are left only in the holes 57a to 57d as the first to fourth conductive plugs 58a to 58d.

Among these conductive plugs, the first conductive plug 58a is used to control the potential of the lower electrode 11a of the capacitor Q, and the second conductive plug 58b is used to control the potential of the upper electrode 30a. Moreover, the fourth conductive plug 58d above the p-type impurity diffusion region 51 is used to control the potential of the first p well 8 functioning as an electrode of the capacitor Q.

Then, a metal stacked film including an aluminum film is formed on the respective conductive plugs 58a and 58d and on the sixth insulating film 57 by the sputtering method. Then, the metal stacked film is patterned to form metal wirings 59.

Thus, a basic structure of the sample is completed.

In the example described above, as described with reference to FIG. 1I, wet-etching is adopted instead of dry etching as a method of etching the first silicon oxide film 14a so as not to damage the surface of the silicon substrate 1 exposed in the transistor formation regions $III_H$ to $III_L$.

The adoption of the wet-etching, however, leads to the formation of the thin portion 14x in the second insulating film 14 as illustrated in the dotted circle of FIG. 1I.

This involves a need to enlarge the diameter D of the opening 30c in the upper electrode 30a in order to prevent the leak current P from flowing through the thin portion 14x between the lower electrode 11a and the upper electrode 30a as illustrated in a dotted circle of FIG. 1R. This prevents the size reduction of the semiconductor device.

In the process described above, the size of the semiconductor device cannot be reduced while achieving the reduction of damage to the surface of the silicon substrate 1 in the transistor formation regions $III_H$ to $III_L$. Thus, there is a room for improvement so that both the reduction of size and the reduction of damage can be achieved.

In view of the findings described above, the inventors of the subject application have come up with an embodiment described below.

Embodiment

FIGS. 2A to 2K are cross-sectional views in the course of manufacturing a semiconductor device according to the embodiment.

Note that, in the FIGS. 2A to 2K, components which are the same as those described above are denoted with the same reference numerals, and descriptions thereof are omitted.

In this embodiment, a logic embedded memory is formed as a semiconductor device in which a flash memory cell and a logic circuit are mixedly mounted.

In order to form the semiconductor device, the steps of FIGS. 1A to 1H described above are firstly performed to obtain a cross-sectional structure illustrated in FIG. 2A.

At the time when these steps are completed, a silicon substrate as illustrated in a dotted circle of FIG. 2A is in a state of removing a silicon nitride film 14b and a second silicon oxide film 14c in a contact region CR by dry-etching using a second mask pattern 20 as a mask.

In this state, a first silicon oxide film 14a and a first insulating film 10 are still left in the transistor formation regions $III_H$ to $III_L$. Thus, these films 10 and 14a can prevent a surface of a silicon substrate 1 from being damaged by an etching gas turned into plasma.

In this embodiment, the second mask pattern 20 is used as a mask only for the dry-etching in this step. When the first silicon oxide film 14a left below a window 20a of the second mask pattern 20 is wet-etched, a mask different from the second mask pattern 20 is used as described below.

Thus, an etchant used in the wet-etching does not enter an interface between the second mask pattern 20 and the second silicon oxide film 14c, and thus a thin portion 14x as illustrated in the dotted circle of FIG. 1I can be prevented from being formed in a second insulating film 14.

Moreover, the dry-etching of this step is anisotropic etching, and, unlike wet etching, is less likely to proceed in a horizontal direction of the substrate. Accordingly, it is possible, in this step, to prevent the second silicon oxide film 14c and the silicon nitride film 14b from being etched in the horizontal direction of the substrate and thus to prevent the thin portion 14x (see FIG. 1I) from being formed in a portion of the second insulating film 14 around the contact region CR.

Thereafter, the second mask pattern 20 is removed.

Hereinafter, steps are performed for forming insulating films respectively in the transistor formation regions $III_H$ to $III_L$. The insulating films are used as gate insulating films and have different thicknesses from each other.

For the formation of the gate insulating films, as illustrated in FIG. 2B, photoresist is first coated onto the entire upper surface of the silicon substrate 1, and is exposed to light and developed. Thus, a seventh mask pattern 60 covering the regions I, II, and $III_L$ is formed.

Note that, the first silicon oxide film 14a in the high voltage transistor formation region $III_H$ and the middle voltage transistor formation region $III_M$ is not covered with the seventh mask pattern 60, and is thus exposed.

Then, the first insulating film 10 and the first silicon oxide film 14a in the regions $III_H$ and $III_M$ are removed by wet-etching using hydrofluoric acid solution as an etchant with use of the seventh mask pattern 60 as a mask. Thus, the surface of the silicon substrate 1 is exposed in the regions $III_H$ and $III_M$.

Performing wet-etching as described above in this step can prevent the surface of the silicon substrate 1 from being damaged by an etching gas turned into plasma, which would otherwise occur in the case when the films 10 and 14a are removed by dry-etching.

Moreover, unlike the step of FIG. 1I, the low voltage transistor formation region $III_L$ among the transistor formation regions $III_H$ to $III_L$ is covered with the seventh mask pattern 60 in this step.

This prevents an element isolation insulating film 2 in the low voltage transistor formation region $III_L$ from being exposed to the hydrofluoric acid solution. Thus, the element isolation insulating film 2 is not etched and the level of an upper surface thereof is not lowered.

Thereafter, the seventh mask pattern 60 is removed.

Next, as illustrated in FIG. 2C, the surface of the silicon substrate 1 in the high voltage transistor formation region $III_H$ and the middle voltage transistor formation region $III_M$ is subjected to thermal oxidation. Thus, a thermal oxide film is formed to a thickness of approximately 9.5 nm as a third insulating film 21.

An oxidation condition in this step is particularly not limited. In this embodiment, the thermal oxidation is performed in an $O_2$ atmosphere under the condition where a substrate temperature is approximately 850° C.

Moreover, as a result of exposure to the $O_2$ atmosphere as described above, a lower electrode 11a in the contact region CR is also oxidized, and the thickness of the first silicon oxide film 14a left on the contact region CR is increased.

Figure 2D:
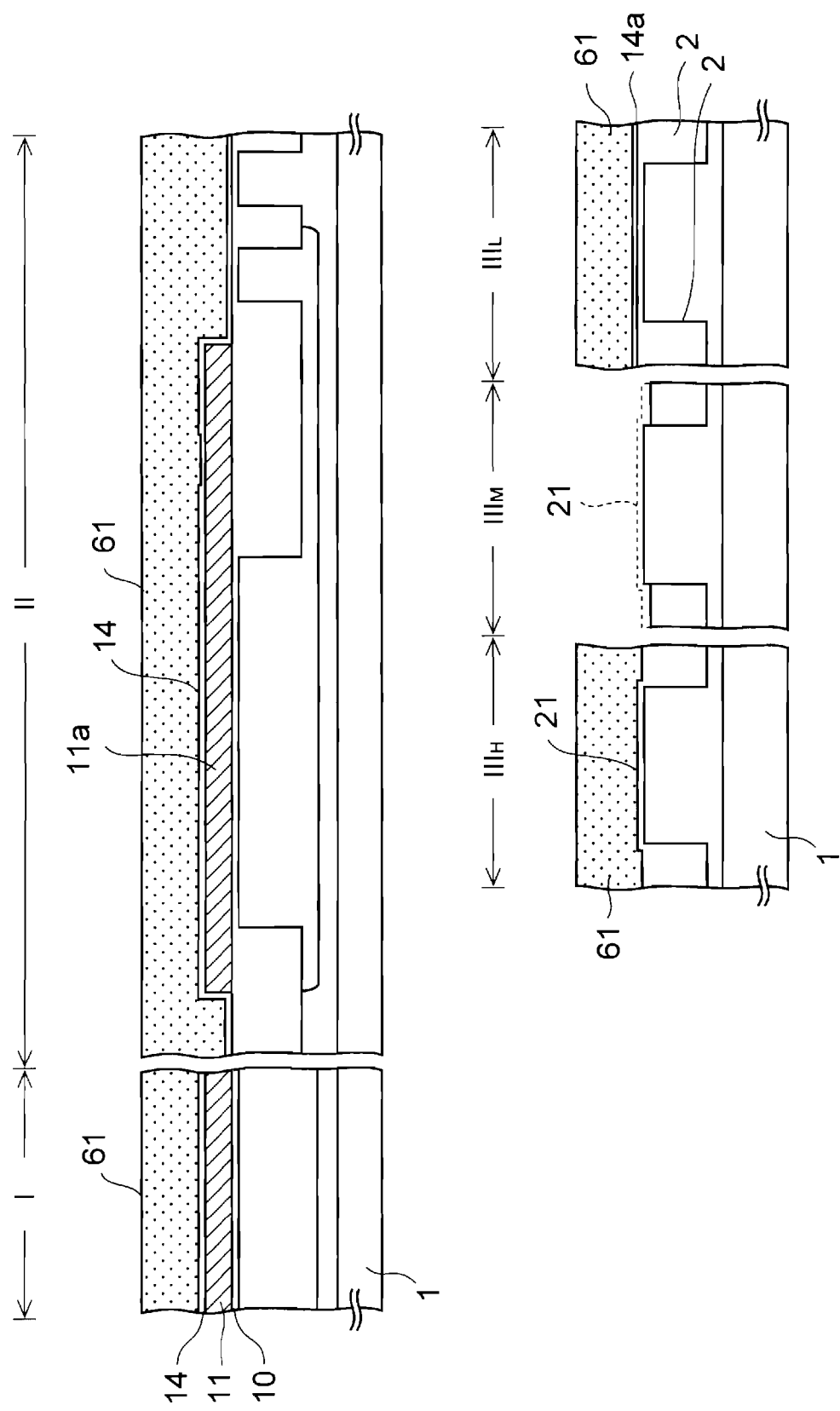

Next, as illustrated in FIG. 2D, photoresist is coated onto the entire upper surface of the silicon substrate 1, and is exposed to light and developed. Thus, an eighth mask pattern 61 is formed.

The eighth mask pattern 61 covers the regions I, II, $III_H$, and $III_L$ other than the middle voltage transistor formation region $III_M$.

Then, the third insulating film 21 in the middle voltage transistor formation region $III_M$ is removed using hydrofluoric acid solution as an etchant with use of the eighth mask pattern 61 as a mask. Thus, the surface of the silicon substrate 1 is exposed.

As in the etching step of FIG. 2B, the low voltage transistor formation region $III_L$ is covered with the eighth mask pattern 61 in this step. Thus, the element isolation insulating film 2 in the region $III_L$ is not etched, and thus the level of the upper surface thereof is not lowered.

Thereafter, the eighth mask pattern 61 is removed.

Figure 2E:
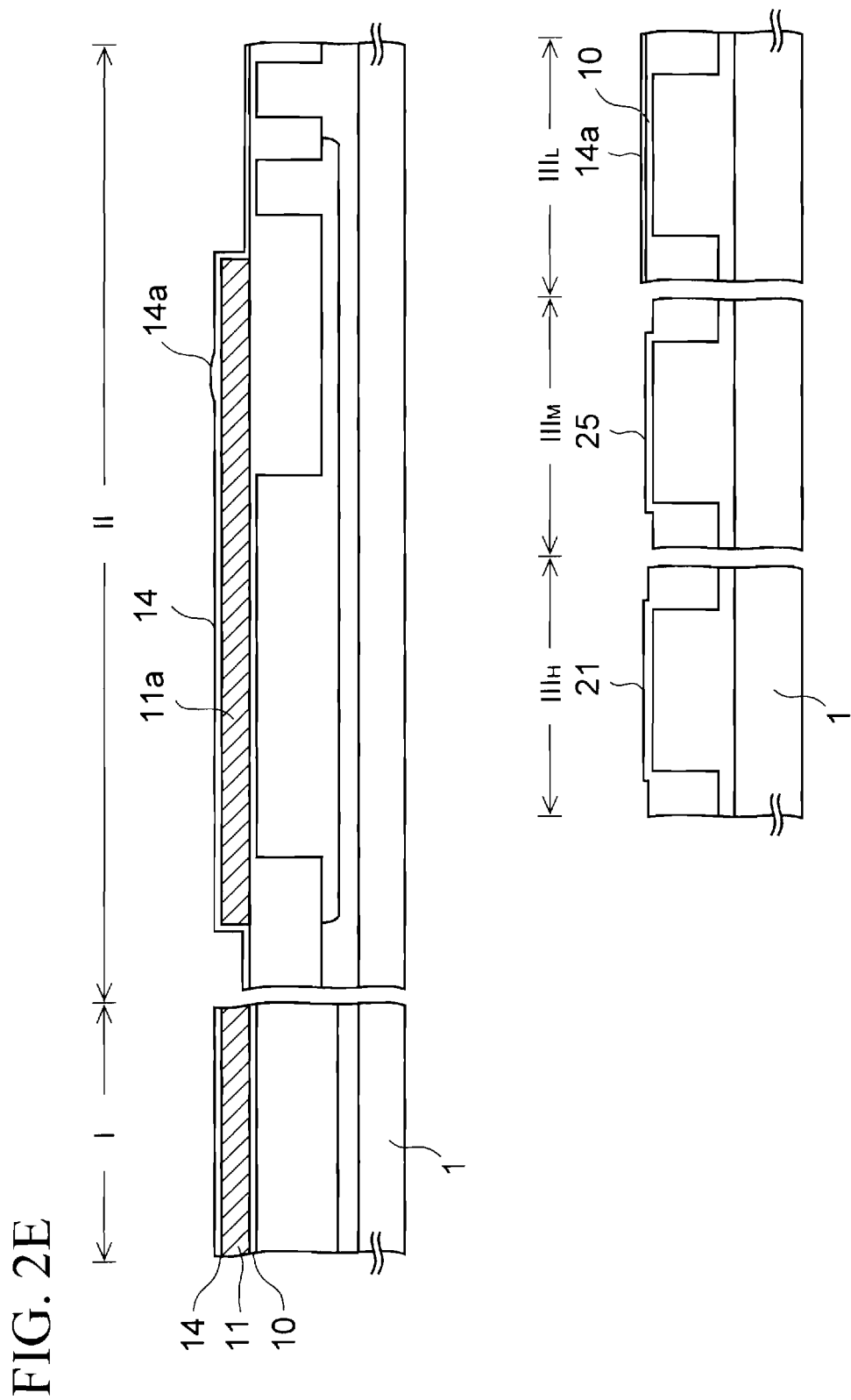

Next, as illustrated in FIG. 2E, the surface of the silicon substrate 1 in the middle voltage transistor formation region $III_M$ is subjected to thermal oxidation in an $O_2$ atmosphere under an oxidation condition in which a substrate temperature is approximately 850° C. Thus, a thermal oxide film with a thickness of approximately 6.0 nm is formed as a fourth insulating film 25.

Figure 2F:
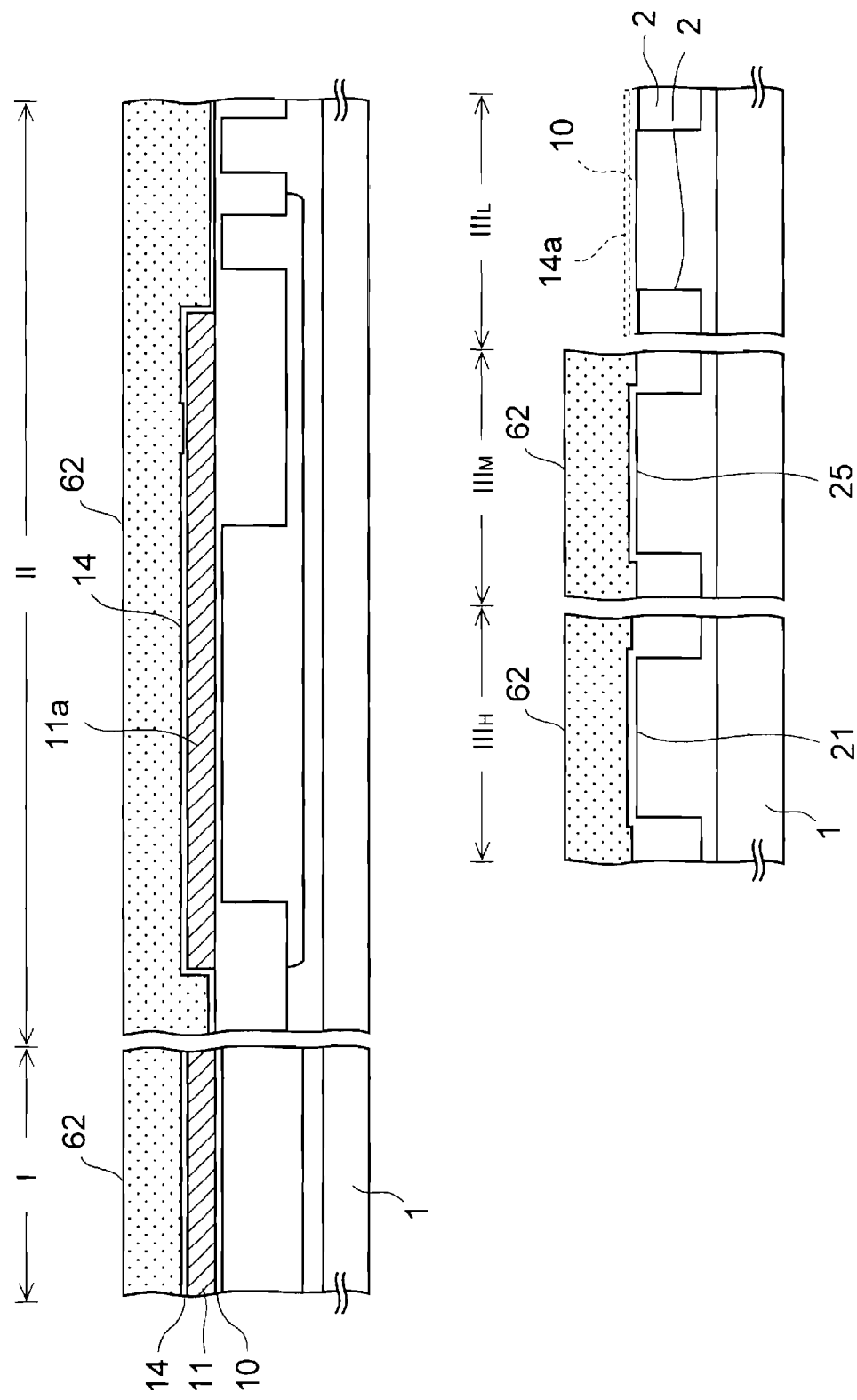

Next, a step performed to obtain a cross-sectional structure illustrated in FIG. 2F will be described.

Firstly, photoresist is coated on the entire upper surface of the silicon substrate 1. Then, the photoresist is exposed to light and developed to thus form a ninth mask pattern 62 covering the regions I, II, $III_H$, and $III_M$.

Note that, the first silicon oxide film 14a in the low voltage transistor formation region $III_L$ is not covered with the ninth mask pattern 62, and is thus exposed.

Thereafter, the first silicon oxide film 14a and the first insulating film 10 in the low voltage transistor formation region $III_L$ are removed by wet-etching using hydrofluoric acid solution as an etchant with use of the ninth mask pattern 62 as a mask.

The ninth mask pattern 62 is removed after this etching is finished.

Figure 2G:
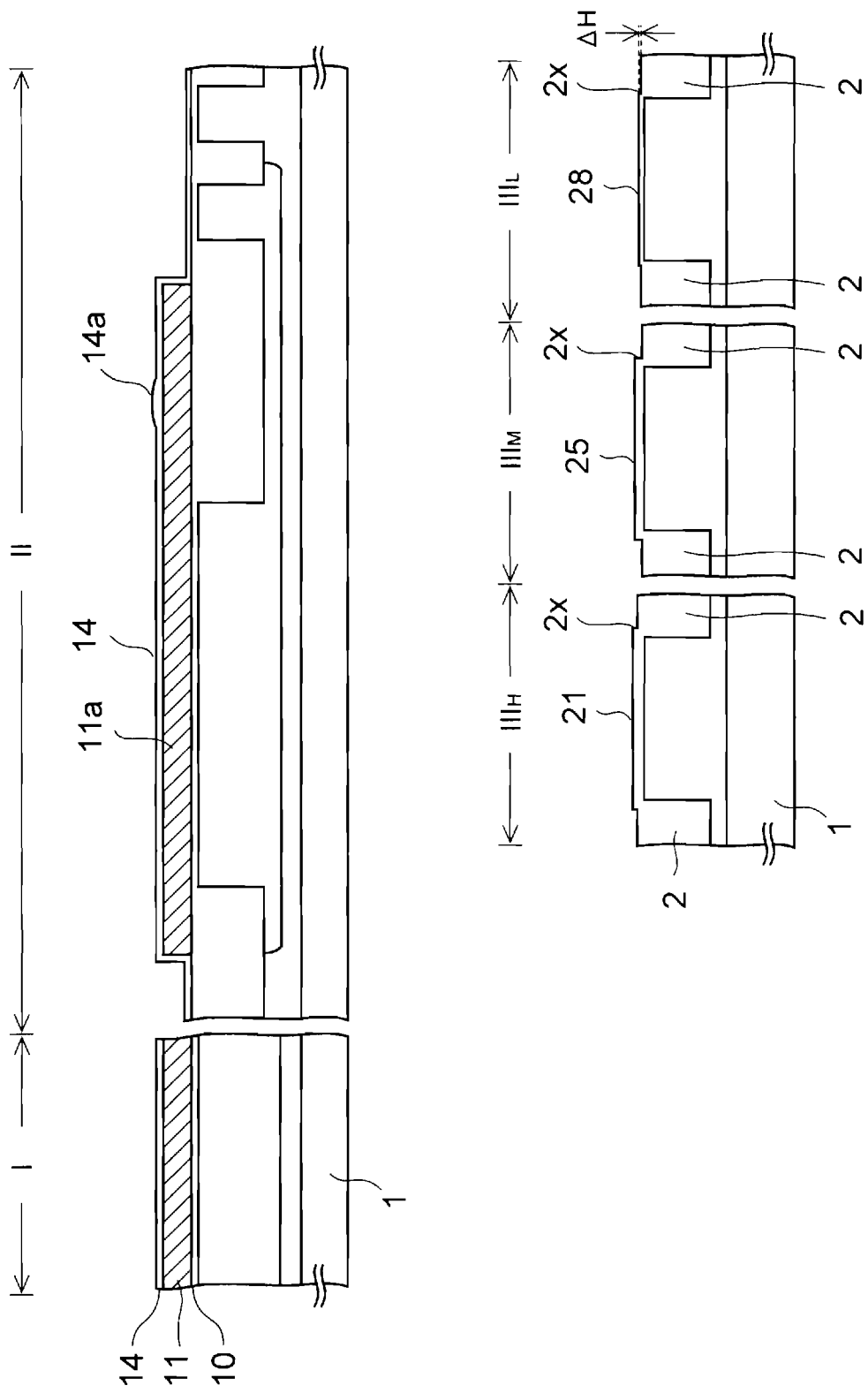

Next, as illustrated in FIG. 2G, a thermal oxide film with a thickness of approximately 1.8 nm is formed by subjecting the exposed surface of the silicon substrate 1 in the low voltage transistor formation region $III_L$ to thermal oxidation. The thermal oxide film serves as a fifth insulating film 28.

The fifth insulating film 28 can be formed, for example, in an $O_2$ atmosphere under an oxidation condition in which a substrate temperature is approximately 850° C.

By performing the steps described above, the insulating films 21, 25, and 28 for use as gate insulating films of MOS transistors are formed in the regions $III_H$ to $III_L$, respectively. The insulating films 21, 25, and 28 have different thicknesses from each other.

The insulating films 21, 25, and 28 are formed on the surface of the silicon substrate 1 which is not exposed to a dry-etching atmosphere of FIG. 2A and thus is not damaged. Thus, the insulating films 21, 25, and 28 have a high film quality such that the films 21, 25, and 28 are durable for use as gate insulating films.

In these steps, thermal oxidation and wet-etching are performed repeatedly as described above in the regions $III_H$ to $III_L$ in order to form the insulating films 21, 25, and 28 which are different in thickness. Reflecting these processes, steps 2x are formed in the element isolation insulating film 2.

The height $\Delta H$ of these steps 2x becomes larger as the number of times of thermal oxidation and wet-etching increases.

In this embodiment, covering the low voltage transistor formation region $III_L$ with the mask patterns 60 and 61 enables the reduction in the number by which wet-etching attacks the element isolation insulating film 2 in the region $III_L$, and thus enables the height $\Delta H$ of these steps 2x in the region $III_L$ to be kept to a minimum.

Figure 2H:
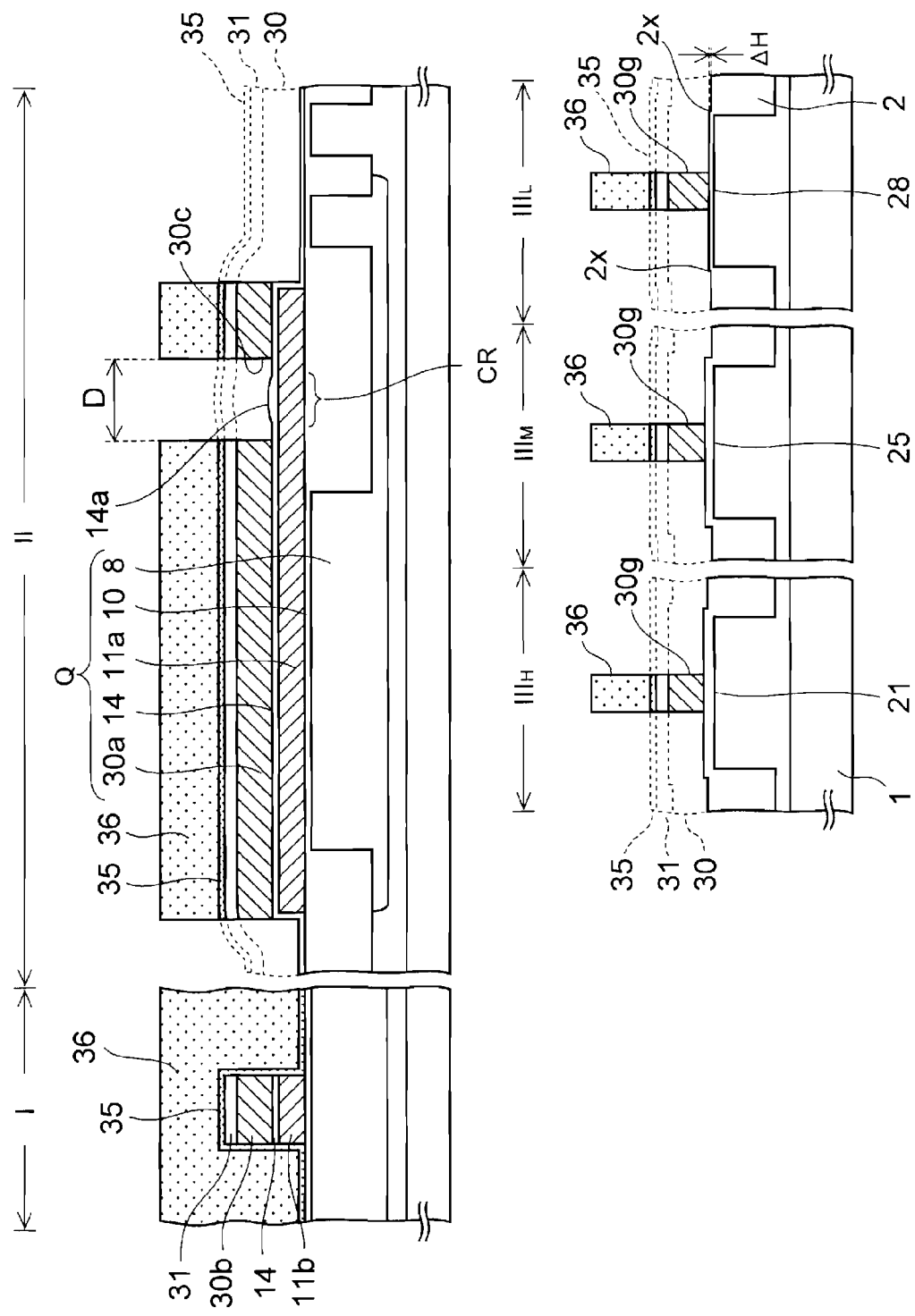

Next, as illustrated in FIG. 2H, with the performance of the steps of FIGS. 1P to 1R described above, a second conductive film 30 is patterned to form an upper electrode 30a of a capacitor Q and gate electrodes 30g of transistors.

As described above, for the pattering, the second conductive film 30 is dry-etched using a sixth mask pattern 36 as a mask.

Then, an opening 30c for exposing the contact region CR of the lower electrode 11a is formed in the upper electrode 30a formed as described above.

An inner surface of the opening 30c is positioned above the second insulating film 14. However, since no thin portion 14x as illustrated in FIG. 1R is formed in the second insulating film 14, leak current is not produced in this embodiment between the electrodes 11a and 30a, which would be otherwise produced due to the thin portion 14x.

Accordingly, there is no need to enlarge the diameter D of the opening 30c for the purpose of preventing the inner surface of the opening 30c from overlapping the thin portion 14x (see FIG. 1R). Hence, the diameter D can be made smaller than that illustrated in FIG. 1R.

This enlarges the opposite areas between the electrodes 11a and 30a around the opening 30c. Thus, the capacitance of the capacitor Q can be maintained even when the external sizes of the respective electrodes 11a and 30a are reduced, and thus the area of the capacitor formation region II can be reduced.

Moreover, in the low voltage transistor formation region $III_L$, since the height $\Delta H$ of the steps 2x in the element isolation insulating film 2 is made to be low as described above. It suppresses variation in a thickness of an anti-reflection film 35 applied by the spin coating method.

Accordingly, the anti-reflection film 35 has the anti-reflection effect against exposure light less variation due to positions. Thus, the second conductive film 30 in the low voltage transistor formation region $III_L$ can be accurately patterned to form the gate electrodes 30g.

Figure 2I:
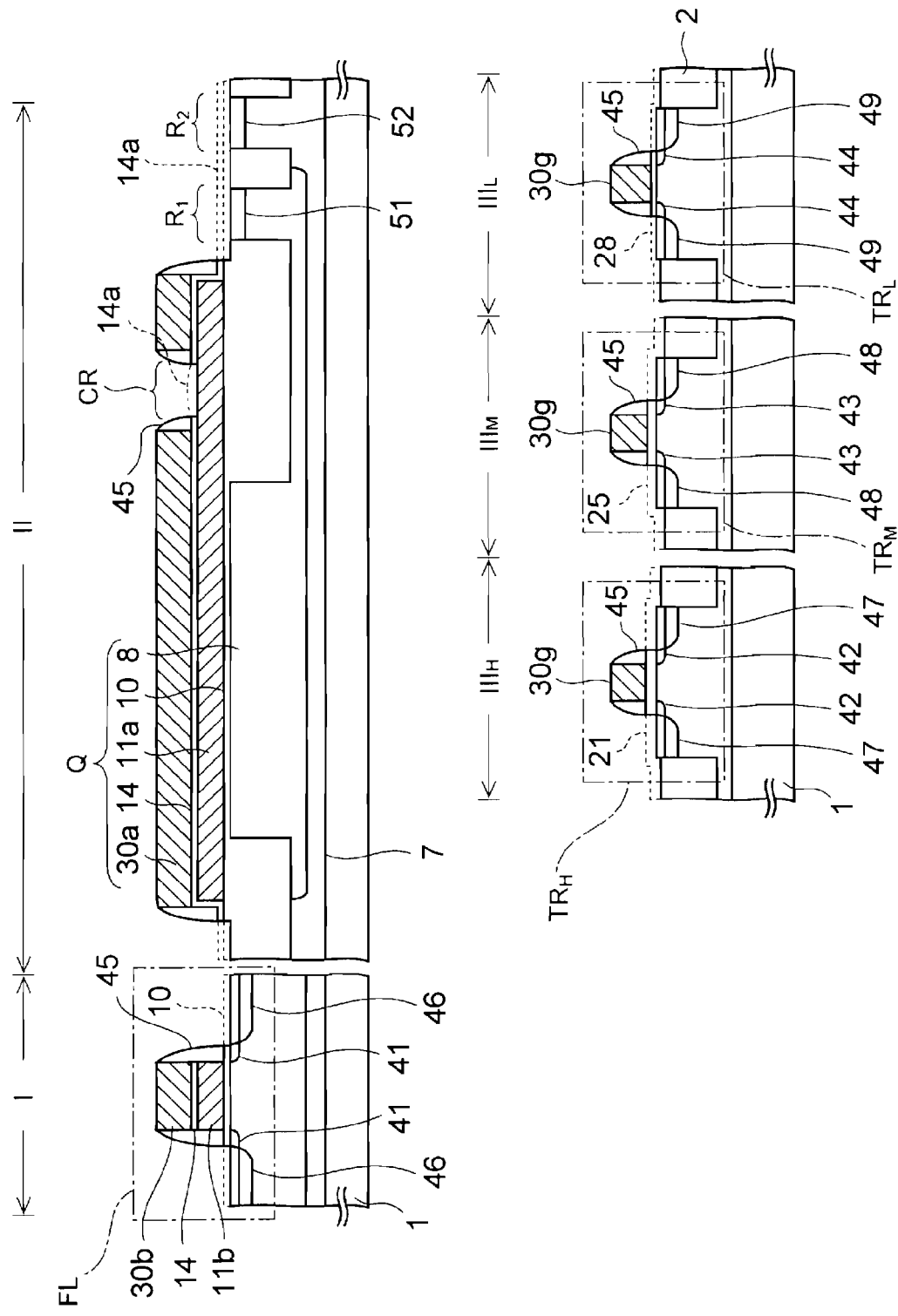

Next, a step performed to obtain a cross-sectional structure illustrated in FIG. 2I will be described.

Firstly, the steps of FIGS. 1S to 1U described above are performed. Thus, a flash memory cell FL is formed in the cell region I, and MOS transistors $TR_H$ to $TR_L$ are formed in the transistor formation regions $III_H$ to $III_L$, respectively.

Next, an entire upper surface of the silicon substrate 1 is exposed to hydrofluoric acid solution, and the insulating films 10, 21, 25, and 28 on source/drain regions 46 to 49 are removed by wet etching. Thus, the surface of the silicon substrate 1 is exposed on both sides of the floating gate 11b and the respective gate electrodes 30g.

At this time, in the contact region CR of the lower electrode 11a, insulating sidewalls 45 formed on side surfaces of the upper electrode 30a serve as masks while the first silicon oxide film 14a is removed by wet etching.

Figure 2J:
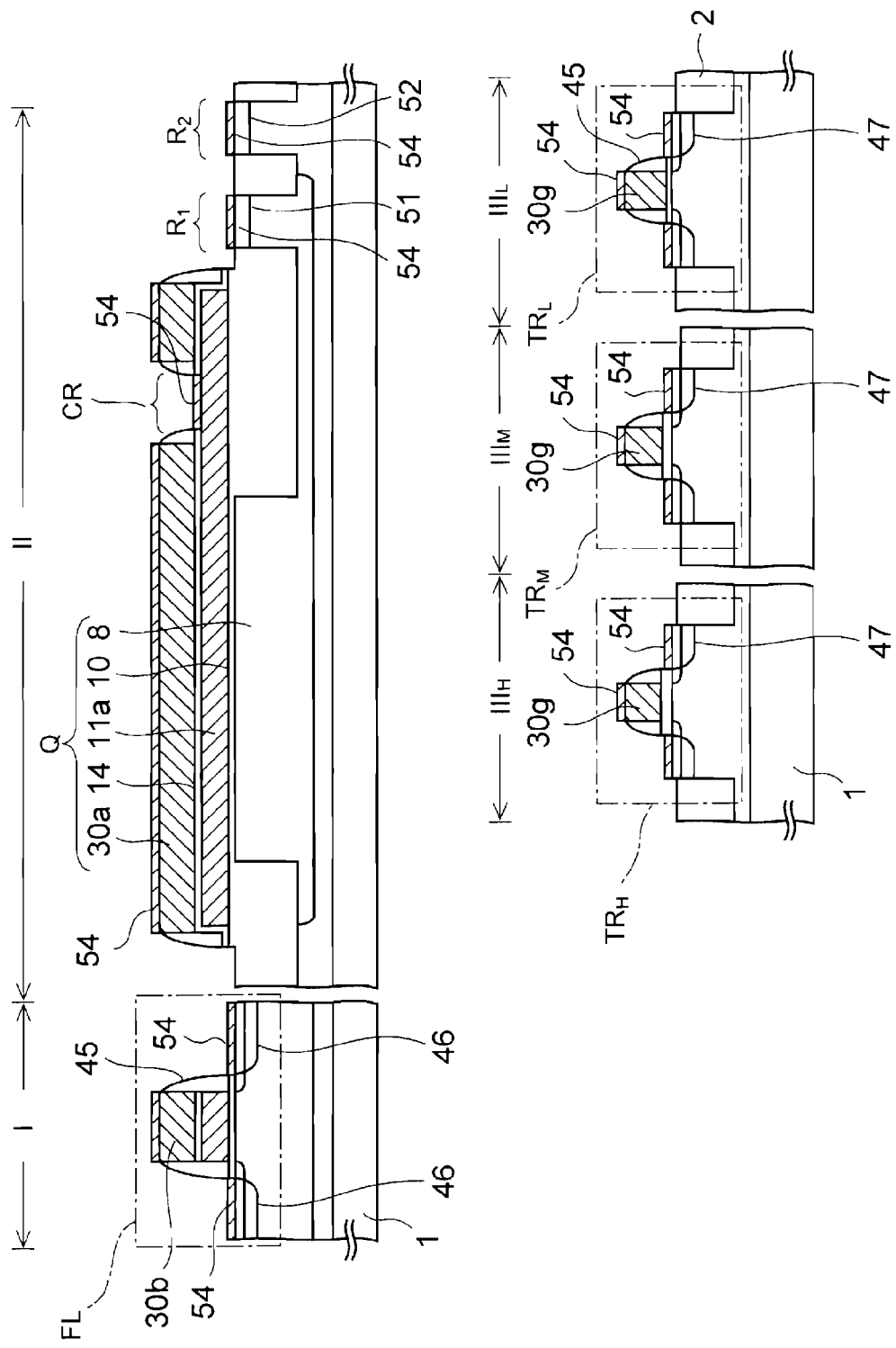

Subsequently, as illustrated in FIG. 2J, a refractory metal film such as a cobalt film or the like is formed on the entire upper surface of the silicon substrate 1 by the sputtering method. Thereafter, the refractory metal film is annealed to react with silicon. Thus, a refractory metal silicide layer 54 is formed above the source/drain regions 46 to 49.

Thereafter, wet-etching is performed to remove unreacted portions of the refractory metal film on the element isolation insulating film 2 and the insulating sidewalls 45.

Figure 2K:
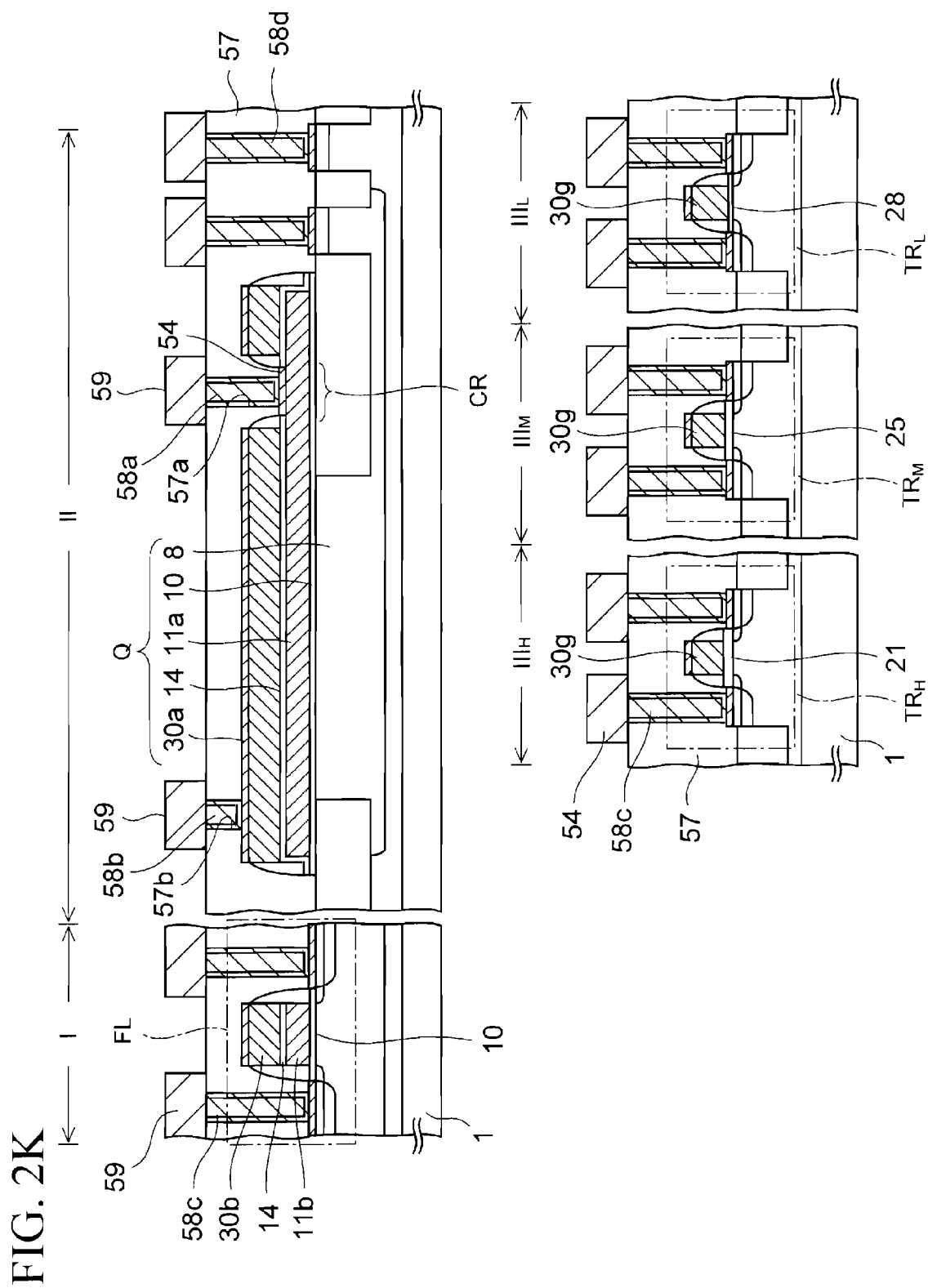

Subsequently, the step of FIG. 1W described above is performed to thereby complete a basic structure of the semiconductor device according to this embodiment as illustrated in FIG. 2K.

According to the embodiment described above, at the point of forming the upper electrode 30a, the first silicon oxide film 14a on the contact region CR of the lower electrode 11a is left without being wet-etched as illustrated in FIG. 2H.

Accordingly, at this point, the thin portion 14x (see FIG. 1I), which would otherwise be formed due to wet-etching, is not formed in the second insulating film 14.

Thereby, there is no need to worry about reduction in withstanding voltage of the capacitor Q. Otherwise, the reduction would be caused by the overlapping of the inner surface of the opening 30c (see FIG. 2H) of the upper electrode 30a with the thin portion 14x. Thus, the diameter D of the opening 30c can be made smaller than that in FIG. 1R, and thereby the semiconductor device can be reduced in size.

In addition, since the region $III_L$ is covered with the mask patterns 60 and 61 (see FIGS. 2B and 2D) the region $III_L$ with the mask patterns 60 and 61 (see FIGS. 2B and 2D), it is possible to reduce the height ΔH of the steps 2x formed in the element isolation insulating film 2 in the low voltage transistor formation region $III_L$. As a result, it is possible to suppress variation in a thickness of the anti-reflection film 35, which would be caused due to the steps 2x as described with reference to FIG. 2H. This leads to improvement in accuracy of the patterning of the gate electrode 30g in the region $III_L$.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:
    forming a first insulating film in a first region, a second region, and a third region of a semiconductor substrate;
    forming a flash memory cell including a floating gate, a second insulating film, and a control gate on the first insulating film in the first region;
    forming a first electrode of a capacitor on the first insulating film in the second region;
    forming a first silicon oxide film, a silicon nitride film on the first silicon oxide film, and a second silicon oxide film on the silicon nitride film as the second insulating film on the first electrode and on the first insulating film in the third region;
    selectively dry-etching the second insulating film on a partial region of the first electrode to remove the silicon nitride film and the second silicon oxide film with the first silicon oxide film on the partial region of the first electrode being left;
    selectively wet-etching and removing the first insulating film and the second insulating film in the third region with the first silicon oxide film on the partial region of the first electrode being covered by a mask and thereby being left;
    forming a third insulating film by subjecting a surface of the semiconductor substrate in the third region to thermal oxidation after the selectively wet-etching and removing the first insulating film and the second insulating film;
    forming a first gate electrode on the third insulating film;
    forming a second electrode of the capacitor on a region of the second insulating film on the first electrode other than the partial region;
    etching and removing the first silicon oxide film in the partial region after forming the second electrode;
    forming a fourth insulating film in the first region, the second region, and the third region after forming the second electrode and the first gate electrode;
    forming a hole in the fourth insulating film in the partial region; and
    forming a conductive plug in the hole.

2. The method of manufacturing a semiconductor device according to claim 1, further comprising forming a well as an electrode of the capacitor in the semiconductor substrate in the second region.

3. The method of manufacturing a semiconductor device according to claim 1, wherein
    in the forming of the first insulating film, the first insulating film is formed in a fourth region of the semiconductor substrate,
    in the forming of the second insulating film, the second insulating film is formed on the first insulating film in the fourth region,
    in the selectively wet-etching and removing of the first insulating film and the second insulating film, the first insulating film and the second insulating film in the third region are etched and removed while the second insulating film in the second region and the fourth region is covered with a first mask pattern, after the first mask pattern is removed and the third insulating film is formed, the first insulating film and the second insulating film in the fourth region are selectively wet-etched and removed while the third insulating film is covered with a second mask pattern, after the first insulating film and the second insulating film in the fourth region are selectively wet-etched and removed, the surface of the semiconductor substrate in the fourth region is subjected to thermal oxidation to form a fifth insulating film in the semiconductor substrate of the fourth region thinner than the third insulating film, and a second gate electrode is formed on the fifth insulating film.

4. The method of manufacturing a semiconductor device according to claim 3, further comprising:

forming an element isolation insulating film in the semiconductor substrate in the fourth region before the forming the first insulating film;

forming a second conductive film on the fifth insulating film;

forming an anti-reflection film on the second conductive film by a coating method;

forming a third mask pattern on the anti-reflection film; and etching the second conductive film by using the third mask pattern as a mask to form the second gate electrode.

5. The method of manufacturing a semiconductor device according to claim 1, wherein the etching and removing of the first silicon oxide film in the partial region is performed by wet-etching.

6. The method of manufacturing a semiconductor device according to claim 5 further comprising:

forming an insulating sidewall on a side surface of the second electrode, wherein the etching and removing of the first silicon oxide film in the partial region is performed by using the insulating sidewall as a mask.

7. The method of manufacturing a semiconductor device according to claim 6, wherein, in the etching and removing of the first silicon oxide film in the partial region, the third insulating film at both sides of the first gate electrode is etched to expose the surface of the semiconductor substrate at both sides of the first gate electrode.

8. The method of manufacturing a semiconductor device according to claim 1, wherein the forming of the first electrode of the capacitor includes:

forming a first conductive film on the first insulating film in the first region, the second region, and the third region; and patterning the first conductive film to form the first electrode in the second region with the first conductive film being left in the first region and to remove the first conductive film in the third region.

9. The method of manufacturing a semiconductor device according to claim 8, further comprising:

patterning the first conductive film left in the first region into the floating gate.

10. The method of manufacturing a semiconductor device according to claim 1, wherein the forming of the second electrode and the forming of the first gate electrode are performed as a single step.

11. The method of manufacturing a semiconductor device according to claim 10, further comprising:

forming a second conductive film on the second insulating film in the second region and on the third insulating film in the third region after the selectively dry-etching the second insulating film on the partial region; and patterning the second conductive film to form the second electrode in the second region and to form the first gate electrode in the third region.

12. The method of manufacturing a semiconductor device according to claim 1, wherein, in the forming of the second electrode, an opening is formed in the second electrode in the partial region.

13. The method of manufacturing a semiconductor device according to claim 1, wherein the forming of the first insulating film is performed by subjecting the surface of the semiconductor substrate in the first region, the second region, and the third region to thermal oxidation.

14. A method of manufacturing a semiconductor device comprising:

forming a first insulating film in a first region, a second region, and a third region of a semiconductor substrate;

forming a first conductive film on the first insulating film in the first region, the second region, and the third region;

patterning the first conductive film to form a first electrode of a capacitor in the second region and to remove the first conductive film in the third region with the first conductive film being left in the first region;

forming a first silicon oxide film, a silicon nitride film on the first silicon oxide film, and a second silicon oxide film on the silicon nitride film as a second insulating film on the first conductive film in the first region, on the first electrode in the second region, and on the first insulating film in the third region;

selectively dry-etching the second insulating film on a partial region of the first electrode and in the third region to remove the silicon nitride film and the second silicon oxide film with the first silicon oxide film on the partial region of the first electrode being left;

selectively removing the first insulating film and the first silicon oxide film in the third region with the first silicon oxide film on the partial region of the first electrode being covered by a mask and thereby being left;

subjecting a surface of the semiconductor substrate in the third region to thermal oxidation to form a third insulating film in the semiconductor substrate of the third region after removing the first insulating film and the first silicon oxide film;

forming a second conductive film on the second insulating film in the first region, on the second insulating film in the second region, and on the third insulating film in the third region;

patterning the first conductive film, the second insulating film, and the second conductive film in the first region to form a flash memory cell including a floating gate, the second insulating film, and a control gate;

patterning the second conductive film in the second region and the third region to form a second electrode of the capacitor in the second region except for the partial region and to form a first gate electrode in the third region;

wet-etching and removing the first silicon oxide film in the partial region after forming the second electrode and the first gate electrode;

forming a fourth insulating film in the first region, the second region, and the third region after forming the second electrode and the first gate electrode;

forming a hole in the fourth insulating film in the partial region; and forming a conductive plug in the hole.

15. The method of manufacturing a semiconductor device according to claim 14, further comprising:

forming a well as an electrode of the capacitor in the semiconductor substrate in the second region.

16. The method of manufacturing a semiconductor device according to claim 14, wherein in the forming of the first insulating film, the first insulating film is formed in a fourth region of the semiconductor substrate, in the forming of the second insulating film, the second insulating film is formed on the first insulating film in the fourth region, in the selectively removing of the first insulating film and the second insulating film, the first insulating film and the second insulating film in the third region are etched and removed while the second insulating film in the second region and the fourth region is covered with a first mask pattern, after the first mask pattern is removed and the third insulating film is formed, the first insulating film and the second insulating film in the fourth region are selectively wet-etched and removed while the third insulating film is covered with a second mask pattern, after the first insulating film and the second insulating film in the fourth region are selectively wet-etched and removed, the surface of the semiconductor substrate in the fourth region is subjected to thermal oxidation to form a fifth insulating film in the semiconductor substrate of the fourth region thinner than the third insulating film, and a second gate electrode is formed on the fifth insulating film.

17. The method of manufacturing a semiconductor device according to claim 16, further comprising:

forming an element isolation insulating film in the semiconductor substrate in the fourth region before the forming the first insulating film;

forming a second conductive film on the fifth insulating film;

forming an anti-reflection film on the second conductive film by a coating method;

forming a third mask pattern on the anti-reflection film; and etching the second conductive film by using the third mask pattern as a mask to form the second gate electrode.

18. The method of manufacturing a semiconductor device according to claim 14, wherein the etching and removing of the first silicon oxide film in the partial region is performed by wet-etching.

19. The method of manufacturing a semiconductor device according to claim 18 further comprising:

forming an insulating sidewall on a side surface of the second electrode, wherein the etching and removing of the first silicon oxide film in the partial region is performed by using the insulating sidewall as a mask.

20. The method of manufacturing a semiconductor device according to claim 19, wherein, in the etching and removing of the first silicon oxide film in the partial region, the third insulating film at both sides of the first gate electrode is etched to expose the surface of the semiconductor substrate at both sides of the first gate electrode.

* * * * *